United States Patent [19]

Plumb et al.

[11] Patent Number: 4,743,767

[45] Date of Patent: May 10, 1988

[54] SYSTEMS AND METHODS FOR ION IMPLANTATION

[75] Inventors: Frederick Plumb, Horsham; Christopher Wright, Findon; Nicholas J. Bright, Cowfold; Derek Aitken, Dorking; Bernard Harrison, Copthorne, all of England

[73] Assignee: Applied Materials, Inc., Santa Clara, Calif.

[21] Appl. No.: 905,719

[22] Filed: Sep. 9, 1986

Related U.S. Application Data

[63] Continuation-in-part of Ser. No. 774,110, Sep. 9, 1985.

[51] Int. Cl.⁴ ............................................ H01J 37/317
[52] U.S. Cl. .............................. 250/492.2; 250/492.2; 250/398
[58] Field of Search .................... 250/492.21, 492.2; 364/488, 357

[56] References Cited

U.S. PATENT DOCUMENTS

| | | | |
|---|---|---|---|
| 3,413,517 | 11/1968 | Barber et al. | 315/106 |
| 4,090,106 | 5/1978 | Okumura et al. | 315/107 |
| 4,126,814 | 11/1978 | Marlowe | 315/307 |
| 4,234,797 | 11/1980 | Ryding | 250/492.21 |
| 4,253,048 | 2/1981 | Osako | 315/307 |
| 4,398,132 | 8/1983 | Razin et al. | 315/307 |
| 4,421,993 | 12/1983 | Bloomer | 307/126 |
| 4,454,453 | 6/1984 | Sugawara | 315/106 |
| 4,517,465 | 5/1985 | Gault et al. | 250/492.21 |
| 4,578,589 | 3/1986 | Aitken | 250/281 |
| 4,587,433 | 5/1986 | Farley | 250/492.21 |
| 4,628,209 | 12/1986 | Wittkower | 250/442.1 |

FOREIGN PATENT DOCUMENTS

57-88661  6/1982  Japan ............................. 250/492.21

OTHER PUBLICATIONS

T. C. Smith, Wafer Cooling and Photoresist Masking Problems in Iion Implanation, Motorola MOS Group-/Advanced Product R&D Labs, Mesa, Ariz. 85202, U.S.A., date unknown.

Primary Examiner—Carolyn E. Fields
Assistant Examiner—John A. Miller
Attorney, Agent, or Firm—Flehr, Hohbach, Test, Albritton & Herbert

[57] ABSTRACT

An ion implantation system includes a beam generating arrangement for generating an ion beam characterized by good beam stability and for directing the ion beam along a prearranged path. A beam stopping arrangement is disposed in the path of the beam for stopping and collecting the ions in the beam. A workpiece scanning arrangement is positioned upstream of the beam stopping arrangement for scanning a workpiece through the beam in a prearranged combined fast scan directional motion and a slow scan directional motion with the slow scan directional motion being characterized by an end of scan position in which the ion beam falls completely on the beam stopping arrangement. A dose measuring arrangement is coupled to the beam stopping arrangement and includes arrangements for measuring the ion beam current on the beam stop at the end of scan position of the workpiece scanning arrangement, for calculating the average ion beam current striking the workpiece during each slow scan directional motion as the average of two successive ion beam current measurements before and after the motion, and for calculating the ion dose delivered to the workpiece based on the calculated average ion beam current and know geometrical factors associated with the fast and slow scan motions.

5 Claims, 27 Drawing Sheets

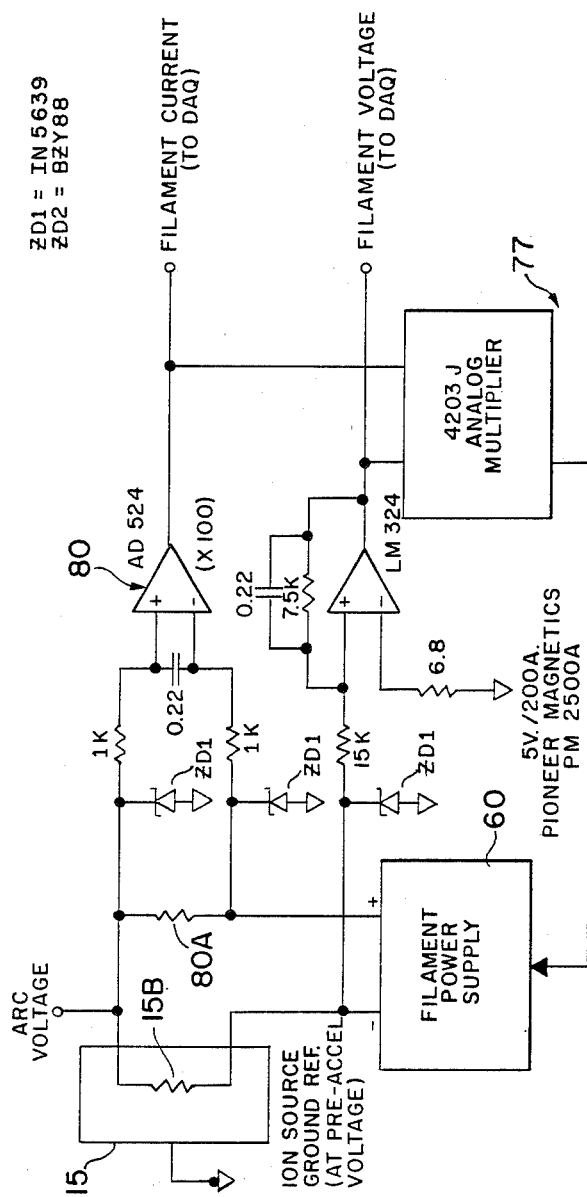
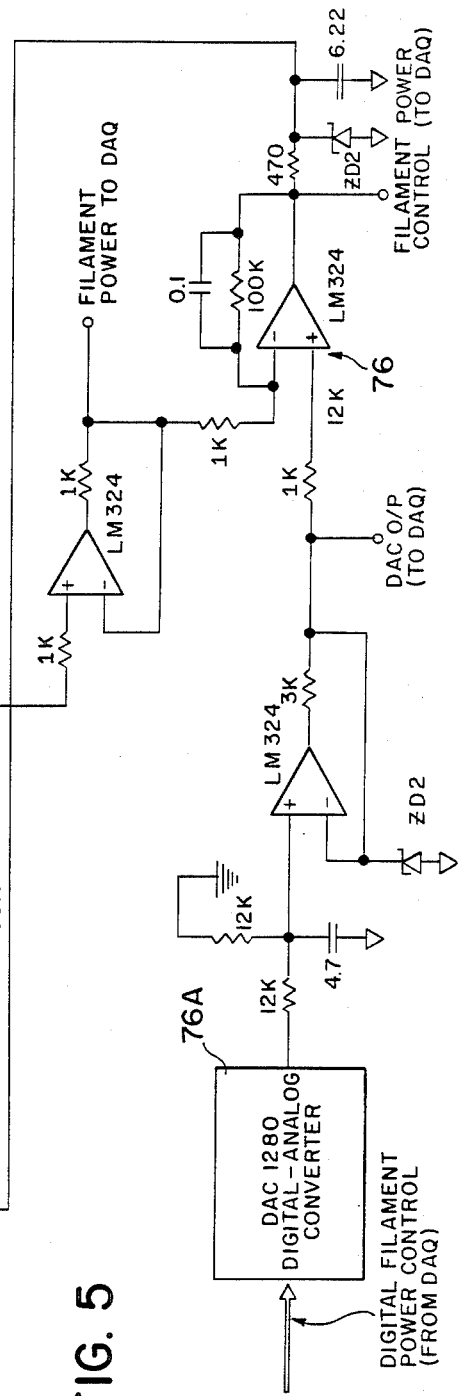
FIG. 5

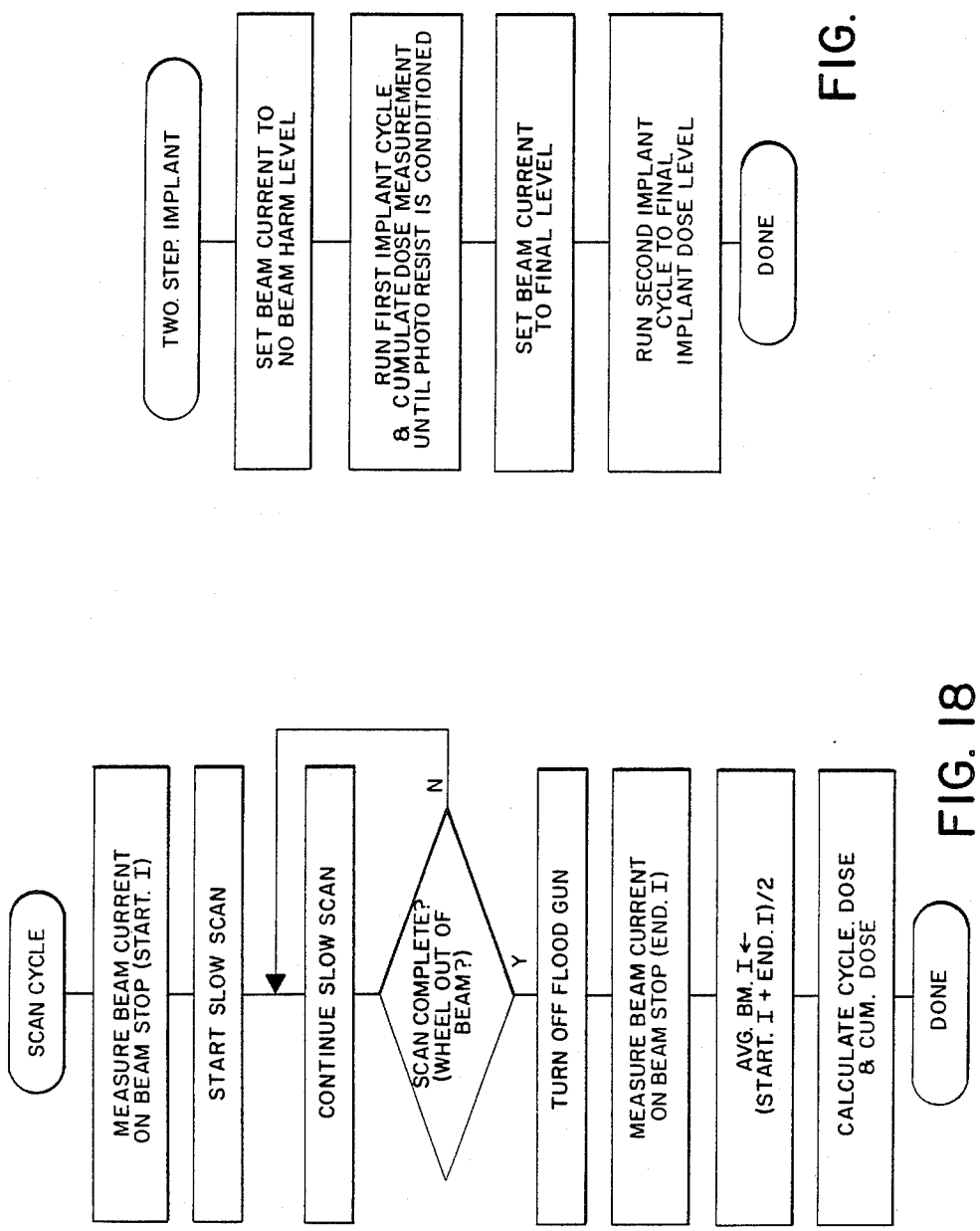

```
User0: FINAL TEST      Mode: Active/Expert user              25-Jun-86   15:43:06
Print Daqs-F/Os     Vacuum   Processor   Load lock    Beamline        Facilities
4 AF (1060-27259) Implant Started
Auto wheel sequence, set to Man implant request
                              Implanter Manual Control
```

| Load | No of scans | Scan speed | |
|---|---|---|---|
| 1 2 3 4 5 | Actual 132 | Actual 10.16 | Beam current: |
| Unload | Set    351 | Set    10.17 | 671.55  2704.51 |
| 1 2 3 4 5 | Energy 20.22 + 60.17  Kv | | Transfer ratio: 6.59 |
| Batch load done | Scanning wheel Beam center_delta 0.00 mm | | Arc current: 528.08 |
| TS 8  0.01 | TS 6  0.02   TS 4  0.01   IG ******** | | TS 3  0.01   IG ******** |

```
Run Number:     163      Species : No Species
Photoresist wafers No    Beam ok: Arc □  Ext □  Focus □  PreA □  Mag □  PostA □
Elapsed time:   953.14   Required dose: 3.000e15   Minimum beam I:  2480.77
Remaining time: 1319.36  Measured dose: 1.128e15   Maximum beam I:  3032.05
Recovery mode: Run the implant
Abort implant      Lower min I    Start      [MENU]  [DATA]  [EXE]  [QUIT]
Continue           Hold           implant
Ignore problems    Raise max I
```

FIG. 29A

```
User0: FINAL TEST      Mode: Active/Expert user              25-Jun-86   15:45:30
Print Daqs-F/Os     Vacuum   Processor   Load lock    Beamline        Facilities
4 AF (1060-27259) Implant Started
Auto wheel sequence, set to Man implant request
                              Implanter manual control
```

| Load | No of scans | Scan speed | |
|---|---|---|---|
| 1 2 3 4 5 | Actual 151 | Actual 10.16 | Beam current: |
| Unload | Set    352 | Set    10.17 | 2655.67  2697.19 |
| 1 2 3 4 5 | Energy 20.22 + 60.17  Kv | | Transfer ratio: 6.57 |
| Batch load done | Scanning wheel Beam center_delta 0.00 mm | | Arc current: 525.03 |
| TS 8  0.01 | TS 6  0.01   TS 4  0.01   IG ******** | | TS 3  0.01   IG ******** |

```
Run Number:     163      Species: No Species
Photoresist wafers No    Beam ok: Arc □  Ext □  Focus □  PreA □  Mag □  PostA □
Elapsed time:   1091.73  Required dose: 3.000e15   Minimum beam I:  2480.77
Remaining time: 1205.42  Measured dose: 1.290e15   Maximum beam I:  3032.05
Recovery mode: Run the implant
Abort implant      Lower min I    Start      [MENU]  [DATA]  [EXE]  [QUIT]
Continue           Hold           implant
Ignore problems    Raise max I
```

FIG. 29B

```
User0: FINAL TEST     Mode: Active/Expert user              25-Jun-86 15:53:57
  Print   Daqs-F/Os  Vacuum   Processor  Load lock  Beamline  Facilities
  4 AF (1060-27259) Implant Started
  Auto wheel sequence, set to Man implant request
                        Implanter manual control
```

Load
| 1 | 2 | 3 | 4 | 5 |

No of scans      Scan speed
Actual  221      Actual  10.16
Set     352      Set     10.17
Energy  20.22 + 60.17        Kv Beam current:
793.65  2698.41
Transfer ratio:
        6.57
Arc current:
        528.08
TS 3        IG
 0.01   *********

Unload
| 1 | 2 | 3 | 4 | 5 |

Scanning wheel
Beam center delta 0.00          mm
TS 6    TS 4       IG
 0.02    0.01      *********

Batch load done
TS 8
 0.01

Run Number:     163        Species:  No Species
Photoresist wafers No      Beam ok: Arc ☐  Ext ☐  Focus ☐  PreA ☐  Mag ☐  PostA ☐
Elapsed time:  1600.59     Required dose: 3.000e15  Minimum beam I: 2480.77
Remaining time: 785.62     Measured dose: 1.887e15  Maximum beam I: 3032.05
Recovery mode: Run the implant
Abort implant   Lower min I   Start
Continue        Hold          implant    [MENU]  [DATA]  [EXE]  [QUIT]
Ignore problems Raise max I

FIG. 29C

```
User0: FINAL TEST     Mode: Active/Expert user              25-Jun-86 16:03:03
  Print   Daqs-F/Os  Vacuum   Processor  Load lock  Beamline  Facilities
  4 AF (1060-27259) Implant Started
  Auto wheel sequence, set to Man implant request
                        Implanter manual control
```

Load
| 1 | 2 | 3 | 4 | 5 |

No of scans      Scan speed
Actual  297      Actual  10.16
Set     360      Set     10.17
Energy  20.22 + 60.17        Kv Beam current:
1672.77  2487.79
Transfer ratio:
        6.34
Arc current:
        528.08
TS 3        IG
 0.01   *********

Unload
| 1 | 2 | 3 | 4 | 5 |

Scanning wheel
Beam center delta 0.00          mm
TS 6    TS 4       IG
 0.01    0.01      *********

Batch load done
TS 8
 0.01

Run Number:     163        Species:  No Species
Photoresist wafers No      Beam ok: Arc ☐  Ext ☐  Focus ☐  PreA ☐  Mag ☐  PostA ☐
Elapsed time:  2151.54     Required dose: 3.000e15  Minimum beam I: 2480.77
Remaining time: 371.82     Measured dose: 2.511e15  Maximum beam I: 3032.05
Recovery mode: Run the implant
Abort implant   Lower min I   Start
Continue        Hold          implant    [MENU]  [DATA]  [EXE]  [QUIT]
Ignore problems Raise max I

FIG. 29D

SYSTEMS AND METHODS FOR ION IMPLANTATION

CROSS-REFERENCE TO RELATED APPLICATIONS

This application is a continuation-in-part of our earlier filed copending U.S. patent application Ser. No. 774,110, filed Sept. 9, 1985.

FIELD OF THE INVENTION

This invention relates generally to systems and methods for implanting ion beams into target workpieces such as semiconductor wafers. More specifically, this invention relates to systems and methods for implanting a preselected ions into a semiconductor wafer with accurate control of the final implanted dosage.

BACKGROUND OF THE INVENTION

Use of Ion Implantation in Semiconductor Processing

Very great improvements in the scale of integration of semiconductor devices on integrated circuit (IC) chips and the speed of operation of such devices have been achieved over the past several years. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching an improved systems for implanting ions of conductivity modifying impurities into the semiconductor wafer.

Generally, the density of integrated circuits and their speed of operation are dependent largely upon the accuracy and resolution of the lithography and etching apparatus used to form patterns of circuit elements in masking layers on the semiconductor wafer. However, density and speed are also dependent upon tight control of the profile of doped regions in the wafer, i.e., regions to which substantial concentrations of conductivity modifying impurities have been added. Tight control of wafer doping can best be achieved using ion implantation techniques and equipment.

Large scale integration (LSI) and very large scale integration (VLSI) of conductor-insulator-silicon (CIS) devices are improved by making more efficient use of the wafer area, shortening interconnects between devices, producing smaller geometries and reducing noise. All of these improvements are made possible in large part through the use of ion implantation doping methods.

Manufacture of bipolar circuits has also been improved with ion implantation. In this processing technology, improvements have resulted from performing predepositions with ion implantation and simultaneously taking advantage of the low contamination and compatibility with photoresist masking which are characteristics of ion implantation equipment.

It is well-known in the industry that doping small geometric regions of a semiconductor wafer cannot be done adequately with gaseous or spin-on deposition of the dopant material on the surface of the wafer, followed by a high temperature furnace diffusion operation which drives the dopant material into the semiconductor wafer in an isotropic manner, i.e., the dopant molecules travel laterally as well as vertically into the wafer. The kinds of dopant profiles, concentrations and lateral geometries required on an LSIC or VLSIC wafer make ion implantation the doping process of choice. The uniformity of doping achievable only with ion implantation is critical in the fabrication of smaller geometry devices. In addition, doping uniformity across the wafer and repeatability from wafer to wafer, which is achievable with ion implantation, dramatically improves fabrication yields of high density devices. An example of a sequence of ion implantation steps is given in Aitken U.S. Pat. No. 4,578,589 and the semiconductor manufacturing literature contains many examples of process recipes in which a number of important ion implantation steps are involved.

Desirable Features of Ion Implantation Systems

To perform effectively in modern IC manufacturing facilities, ion implantation systems must be capable of efficiently performing most or all of the ion implantation steps required in increasingly complicated wafer processing recipes. High ion beam current levels are required for efficient performance of high dosage implants. Control of implanted beam energy is vital to controlling the profile of the implanted region in the wafer. To achieve such beam energy control over a sufficiently wide range of energies generally requires the use of a post acceleration system. It is also vital to control the total dosage of ions that are implanted into the semiconductor wafer since the electrical characteristics of the implanted region are determined by the concentration of implanted ions.

Aitken U.S. Pat. No. 4,578,589 discloses ion beam line technology that provides dramatically improved performance in an ion implantation system from a number of standpoints. A commercially available ion implantation system called the Precision Implant 9000 system (Applied Materials, Inc., Santa Clara, Calif.) incorporates this invention. These form the preferred environment for the system and method of this invention as applied to ion implantation systems for semiconductor processing and will be used to illustrate the application of the invention. The disclosure of the U.S. Pat. No. 4,578,589 patent is hereby incorporated by specific reference to fill in details of the overall beam line system which are not set forth herein.

It is particularly significant that the beam line technology of the U.S. Pat. No. 4,578,589 patent and the Precision Implant 9000 system provides improved beam current without a radical scale up of the size of beam line components. However, this improved beam current performance tends to exacerbate the problem that all high current ion implanters tend to have in monitoring and controlling the dosage of ions implanted into the wafer. This problem is especially acute when implanting ions at high current levels into wafers which have a photoresist mask pattern formed thereon. It is becoming a common practice in the semiconductor industry to use a patterned layer of photoresist to define the desired pattern of implanted regions in the wafer.

The problem which arises when implanting wafers with a photoresist pattern thereon is the emission of gas from the photoresist layer as it is struck by the ion beam. Collision of substantial numbers of ions in the beam with these gas molecules tends to produce charge transfer from the positively charged ion to the gas molecule, leaving a neutral atom of the desired implant species to be implanted in the semiconductor wafer.

Two adverse effects can be produced by this increased neutralization of ions. If ion beam current measurements are attempted to be made during the actual implantation of the wafers, the beam current measurements will be inaccurate since the neutral atoms of the implanted species will not register as current contributors. Under some conditions, this can cause substantial errors in dose measurement and lead to substantial errors in the control of the overall dose of the implant species in the wafer. The result of such dose errors can be serious defects in the electrical characteristics of the implanted regions and thus circuit operation defects that degrade the yield of working IC chips on the processed wafer.

If this increased gas pressure region infiltrates into the post acceleration system of the implanter and causes neutralization of ions in that region, a substantial number of the implanted atoms will have implant energy errors. This can alter to overall profile of the implanted region in the wafer and also lead to defective circuits and accompanying process yield loss. This problem is especially acute in high current implants with high post acceleration voltages, since this tends to maximize the release of gas from the photoresist layer during the initial portion of the implant. Gradually, the photoresist layer becomes conditioned by the ion beam so that gas emission declines to a tolerable level. By this time the adverse effect on the implant may have already occurred. To counteract this second problem, it has been necessary in some situations to simply perform the implant at a much lower current level than the level which is optimum for efficiency of implanting from a process time standpoint.

Farley U.S. Pat. No. 4,539,217 deals with the dosimetry problem by measuring the gas pressure in the implant region and adding to the actual measured beam current a correction value dependent upon the pressure measured in the implant volume at the time the current reading is taken. The current reading is taken in a Faraday cage type of beam stop when the beam is passing through a slit in the scan wheel that is holding the wafers being processed. While this compensation approach is likely to produce improved accuracy of beam current measurements and thus greater accuracy of implant dose control, there are a number of remaining sources of possible inaccuracy in the method. The gas pressure may be different in the region when the wafers are in the beam than it is when the beam is passing through the slit in the scan wheel carrying the wafers.

The emitted gas pressure changes in a gross measurement sense as the area of the wafers being struck by the beam changes at the ends of the slow scan movement of the scan wheel, but the local pressure in front of the wafer portions being struck by the beam may still be high. Thus the correction based on gross pressure measurement may actually introduce errors into the dose determination during these portions of the slow scan cycle. Any measurement and correction calculation scheme is bound to include compromises with accuracy and in some cases the residual inaccuracy in the dosimetry and resulting errors in the implant dosage may produce yield fall off for the IC devices being manufactured.

SUMMARY OF THE INVENTION

Objects of the Invention

It is the principal object of this invention to provide an improved method for accurately measuring the dose of ions implanted into a workpiece in an ion implantation system.

It is another object of this invention to provide an improved method for controlling the total dose of ions implanted into a workpiece during an overall multiple scan ion implantation process.

It is another object of this invention to provide an improved method for implanting ions in a semiconductor wafer having a patterned layer of photoresist material thereon.

Features and Advantages of the Invention

One aspect of this invention features a method for accurately measuring the dose of ions implanted into a workpiece in an ion implantation system. The method is founded on generating an ion beam characterized by good beam current stability with good beam current stability meaning that, on the whole, the beam current has negligible drift during a single workpiece scan cycle. The ion beam is directed along a prearranged path toward a beam collecting means and a workpiece is scanned through the ion beam in a prearranged combined fast scan directional motion and a slow scan directional motion, with the workpiece entirely leaving the path of the ion beams at the end of each slow scan directional motion.

The ion beam current is measured on the beam collecting means at the end of each slow scan directional motion of the workpiece. Then the average ion beam current striking the workpiece during each slow scan directional motion is calculated as the average of two successive ion beam current measurements before and after the motion. Next, the ion dose delivered to the workpiece is calculated based on the calculated average ion beam current and known geometrical factors associated with the fast and slow scan motions.

By using the method of this invention, dose measurement errors due to increased pressure regions in the path of the ion beam from any outgassing from the workpiece are eliminated. By measuring the ion beam current at a time when the workpiece is totally out of the ion beam, the source of gas pressure has been removed. Furthermore, the gas pressure that existed during the time that the workpiece was being implanted has had time to decay away. This results in the case of semiconductor wafers from the circumstance that the area of wafer struck by the beam declines as the slow scan is nearing completion of the overscan portion. The amount of gas emitted from the wafer declines and, by the time that the wafer is entirely out of the beam, the pumps maintaining low pressure in the chamber will have removed the residual gas.

The method of this invention is especially well suited to being implemented in a computer control arrangement for controlling the total dose of ions implanted into a workpiece during an overall implantation cycle to be substantially equal to a target implant dose level. Preferably this is accomplished by presetting a start current value for the ion beam and a slow scan cycles total before initiating the scanning motion of the workpiece through the beam. This can be accomplished by first measuring the initial ion beam current on the beam collecting means, then calculating a target ion beam current value and a slow scan cycles total value that will produce the target dose of implanted ions with an integral number of slow scan cycle motions based on the initial ion beam current and the known geometrical factors associated with the fast and slow scan motions; and finally controlling the ion beam current to be at the target ion beam current value.

The workpiece scanning, beam current measuring, average current calculating, and ion dose calculating steps are then performed during a plurality of slow scan cycles cumulating toward the slow scan cycles total value. Since, even with a stable ion beam, there may be some drift of the beam current value over a large number of scan cycles, it is preferable to reset the slow scan cycles total at the end of one or more of the slow scan cycles at prearranged intervals during the overall implant based on cumulating the dose measurements and determining the total number of scans needed based on the number of additional scans that must be made to achieve the remaining dosage at the beam current level now being sensed. More specifically, the steps are first to determine the cumulative ion dose delivered to the workpiece at the end of the last slow scan motion based on the cumulative value of calculated ion dose delivered in each of the completed slow scan cycles and then to recalculate a new slow scan cycles total value required to deliver the remaining ion dose to the workpiece based on the last measured value of actual ion beam current and the known geometrical factors. Conveniently this can be done in a dose update routine at the end of each of the slow scan cycles and this dose update routine can be handled off line of the other programs that are running in the computer control system.

Finally, to achieve high final dose accuracy it is preferable to reset the slow scan cycles total and the ion beam current at the end of each of a number of slow scan cycles preceding a last slow scan cycle so that the target dose will be achieved with an integral number of slow scan cycles. This resetting may use substantially the same routine as that for the original setting of the beam current and number of scan cycles except that the target dose becomes the remaining dose to be implanted.

The method of this invention may also be adapted for controlling the total dose of ions implanted into a semiconductor wafer having a patterned mask layer of a photoresist material thereon where the preferred implant ion current and energy level would produce an emitted gas from the photoresist material during an initial portion of the implant at a pressure level which would harm the integrity of the implanting ion beam. This adaptation of the method starts with predetermining a no harm ion beam current level which will maintain ion beam integrity during the initial portion of the implant and a number of slow scans at the no harm current level to achieve conditioning of the photoresist material layer by the ion beam during the initial portion of the implant for reduced emission of gas at the preferred implant ion current level during a final portion of the implant.

The ion beam current is controlled to be at the no harm beam current level during an initial portion of the implant and the wafer is scanned through the ion beam for the predetermined number of slow scans and at the end of each scan performing the current measuring, average current calculating, ion dose calculating, and slow scan cycles resetting steps. Then the ion beam current is controlled to be at the target ion beam current value during the start of the final portion of the implant, and completion of the remaining scan cycles using the general dose measurement and control methods previously described is performed.

The method of this invention provides the advantage of accurate individual scan and cumulative dose measurement as well as tight closed loop monitoring and control on the actual ion dose that is going into the wafer. Relying on actual beam current measurements without any aberating factors gives more accurate beam current measurements than could be achieved by attempting to compensate for the aberating factors.

Other objects, features and advantages of this invention will be apparent from a consideration of the detailed description given below in conjunction with the accompanying drawings.

BRIEF DESCRIPTION OF THE DRAWINGS

FIGS. 5 and 6 are electrical circuit schematic diagrams of arc voltage power supply control circuits and filament power supply control circuits.

FIGS. 18–28 are software flow charts illustrating software routines for implementing the system and method of this invention.

FIGS. 29A–29D depict computer screen formats and information showing the operation of the implanter beam line during the progress of an implant.

DETAILED DESCRIPTION OF EMBODIMENTS OF THE INVENTION

One of the important steps of the method of this invention is the generation of an ion beam characterized by good beam current stability. The preferred approach to implementing this part of the method is a novel ion source control system and method which will now be described in connection with an overall ion implantation system forming the hardware which is preferred for implementing the method of this invention.

Figure 1:
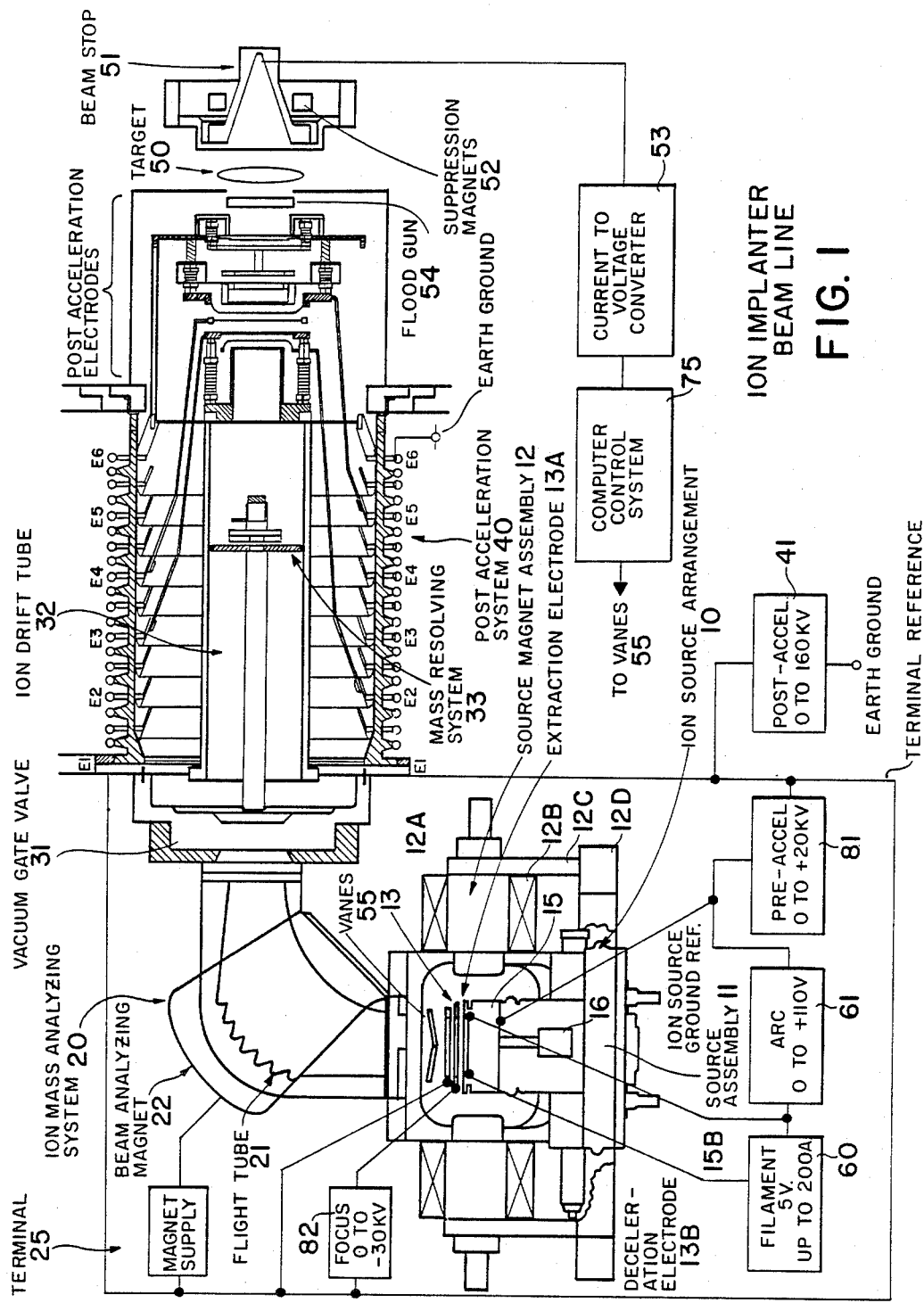
FIG. 1 is a partial section view of an ion implanter beam line which is the preferred system environment for the dose measuring and control method of this invention.
Figure 2:
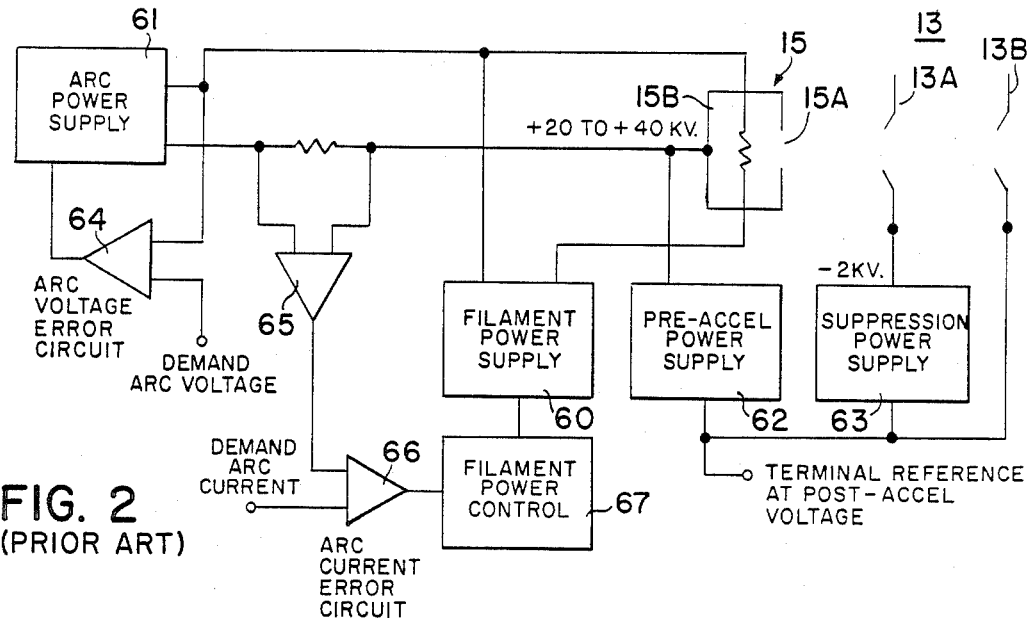
FIG. 2 is a schematic diagram of a prior art ion source control system and ion beam extraction system.

FIG. 1 illustrates, for purposes of example, the basic ion beam line subsystems of an ion implanter. The particular subsystems disclosed in FIG. 1 show the ion optics geometry of the above-referenced Aitken application. The ion source structure and arrangement is a typical Freeman ion source arrangement. FIG. 2 schematically illustrates from a conceptual standpoint, the control of a Freeman ion source utilizing a prior art approach.

Referring to FIGS. 1 and 2, ions are generated in the arc chamber 15 of the Freeman ion source. An extraction electrode assembly 13 extracts a beam of ions through a recangular aperture 15A in the front of the arc chamber 15. The ion beam is both extracted and accelerated toward the mass analyzing system 20 which includes an ion beam flight tube 21 providing a path between the poles of analyzing magnet assembly 22. The ion beam is bent in passing through the analyzing magnet assembly 22, enters an ion drift tube 32, passes through a mass resolving slit 33, is accelerated in a post acceleration system 40, and strikes a target element 50. During a portion of the slow scan cycle, the target element 50 is out of the beam and all of the beam current falls on the beam stop 51. Suppression magnets 52 in the beam stop arrangement 51 produces a magnetic field oriented to prevent escape of secondary electrons from the beam stop and thus to ensure accurate measurement of the beam current. This suppression function is well known and need not be described in detail herein.

A flood gun arrangement shown schematically in FIG. 1 may be positioned in the vicinity of the wafer 50 to assist with neutralizing positive charges which may otherwise build up to a destructive level on the surface of the wafer. In some cases it may also be desirable to inject an inert gas into the region in front of the wafer to create a plasma in that region which may assist in neutralizing the charge build up on the wafer surface.

Ion source assembly 11 includes a magnet assembly 12 which has separate electromagnets with cylindrical poles having their axis aligned with the filament 15B within the arc chamber 15. The source magnets produce higher efficiency of ion generation by causing electrons emitted from the filament 15B to spiral around the filament in a path to walls of the arc chamber 15 serving as the anode and thus increase the ionization efficiency in the source. However, hard driving of the source magnets can effect arc stability.

A post-accel supply 41 is set to a prearranged value between 0 and 160 kilovolts to determine the amount of post-acceleration of the ion beam in the post-acceleration system. This voltage also determines the terminal reference potential on terminal 25 in which is housed the ion source arrangement 10 and the mass analyzing system. All of the ion source operating voltages and the extraction system voltages are referenced to the terminal voltage set by the post-accel supply. Pre-accel supply 81 is set to a value between 0 and +20 kilovolts and that voltage is applied to the ion source chamber 15 where it serves as the ion source ground reference potential. The filament is d.c. biased to a voltage above the ion source chamber by the arc supply 61. The filament 15B is heated by passing electrical current therethrough from filament supply 60.

As shown, decel electrode 13B is directly connected to terminal potential and extraction electrode 13A is supplied with voltage from focus supply 22 which can be set from 0 to −30 kilovolts. The ion beam is extracted from the source chamber by an extraction and accelerating field between the ion source chamber at the preset pre-accel supply potential and the extraction electrode at the preset focus supply voltage value. The value of the output of the pre-accel supply is set according to the amount of pre-accelleration of the beam that is desired. The value of the focus voltage is set during a beam tuning process to obtain the desired ion beam characteristics.

As shown in FIG. 2, the Freeman ion source is operated from an electrical standpoint by coupling a filament power supply 60 across the filament 15B to supply high current at low voltage to the filament. An arc power supply 61 applies a voltage, which is typically clamped to a maximum of about one hundred and seventy volts, between the filament 15B and the arc chamber 15 with the arc chamber serving as an anode. Filament 15B generates thermal electrons which are accelerated through the gas species within the arc chamber and toward the arc chamber walls to create a plasma of the ion species within the arc chamber 15.

A separate pre-accel (or extraction) power supply 62 provides a pre-analysis acceleration voltage of up to forty kilovolts to the arc chamber 15. A suppression power supply 63 provides a slightly negative voltage of around minus two kilovolts to extraction electrode 13A, also known as the suppression electrode. The final electrode 13B is biased at terminal ground reference so that the final ion beam pre-analysis acceleration is determined by the value of the pre-analysis acceleration voltage applied to the arc chamber itself. Terminal ground reference is the value of the post-acceleration voltage applied to the terminal and the value of that voltage determines the final ion beam energy striking the target.

When the target wafer 50 is not intercepting all of the ion beam exiting the post-acceleration region, some of the ion beam falls on the beam stop 51. When the scan wheel carrying the wafers is totally out of the ion beam, all of the ion beam is collected in the beam stop 51 and the ion beam current can be accurately measured at this time. The beam stop arrangement includes suppression magnets 52 to prevent loss of secondary electrons and to maintain current measuring accuracy. The current collected on the beam stop is fed to a current to voltage converter 53 which preferably is the type shown in FIG. 16. The output of the current to voltage converter is fed to a computer control system 75 which is used to perform the dose calculation method of this invention. The computer control system performs a number of control and calculation routines to control the overall ion implantation system and some of these which are important to this invention will be discussed below.

A flood gun arrangement 54 may be incorporated into the system to assist with avoiding charge build up on the surface of a wafer during implanting under some circumstances. The flood gun operation will also be controlled by the computer control system 75. Beam control vanes 55 in the extraction region of the ion source arrangement also function under computer control routines to apply a controlled degree of trim to the ion beam and thus to control the amount of beam current delivered to the wafer 50.

As shown in FIG. 2, the servo control theory implemented in the prior art in an attempt to control and stabilize the operation of the ion source utilizes a constant arc voltage operating mode. An arc voltage error circuit 64 detects the difference between the demanded arc voltage and the actual arc voltage applied between the filament and the anode. Operating in a fast servo loop, the error signal from the arc voltage error circuit 64 controls the arc power supply to maintain the arc voltage at a level very close to the arc voltage demand signal. In some cases the feedback loop is omitted and other means are used to vary the arc voltage, resulting in poor regulation of arc voltage relative to arc current.

Since, for stable ion source operation, it is necessary to keep both the arc voltage and arc current relatively constant, the control of arc current in the prior art approach utilized a feedback loop which controlled filament current or power. In other words, if the arc current dropped, the arc current measuring circuit 65 together with arc current error circuit 66 would attempt to alter the filament power by way of the filament power control circuit 67 to bring the actual arc current back to the level of the demanded arc current. Because of the thermal inertia of a high resistance filament, the filament power control loop for maintaining constant arc current is a slow control loop and is subject to a number of problems and limitations.

Figure 3:
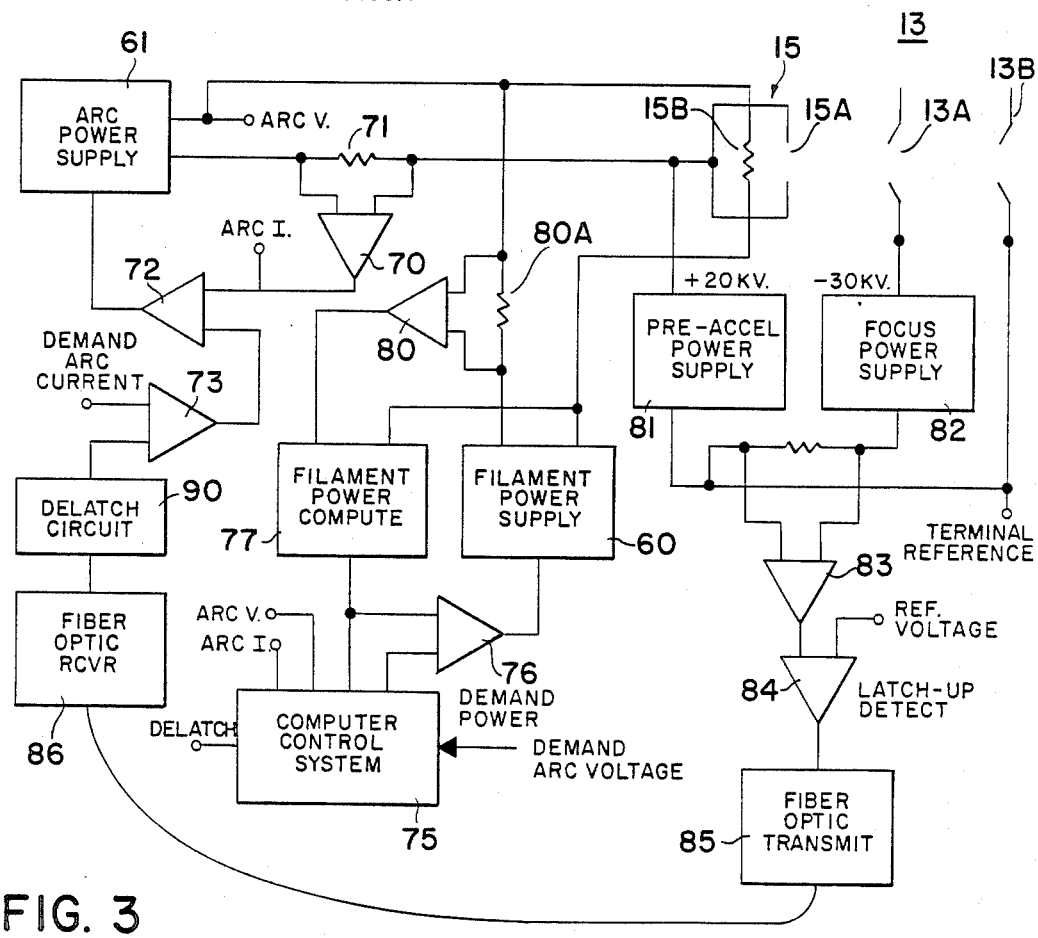
FIG. 3 is a schematic diagram of a system for ion source control in accordance with one portion of this invention.

FIG. 3 illustrates in a schematic manner the source control system and method useful with this invention which basically involves maintaining substantially constant arc current utilizing a fast servo control loop which alters the arc voltage applied between filament-cathode and anode to produce a fast response and control of arc voltage with a relatively slower servo control loop which detects the changes in arc voltage and controls the amount of filament power to bring the arc voltage back to an arc voltage demand value. This new control approach will be referred to as the constant arc current mode of operation. It is also known as the arc voltage control mode since the arc current loop is controlled by arc voltage.

As shown in FIG. 3, the preferred approach to implementation of this system and method is to utilize a hardware control loop for maintaining constant arc current and a software control loop running on a computer control system to implement the slow servo control loop of filament power which maintains arc voltage at a substantially constant value. FIG. 3 also illustrates schematically an anti-latchup system which integrates with the arc power supply control system operating in the constant arc current mode. This portion of the system provides an early detection of an impending beam latchup condition caused by sparking between the arc chamber and the extraction electrode and quickly delatches the beam by pulsing down arc voltage and arc current to quickly shrink the beam and then to quickly recover to normal operating conditions after the delatching function has been accomplished. The details of the operation of this aspect of the invention will be discussed below.

The arc voltage control mode utilizes an arc current detection circuit 70 to detect changes in arc current across a shunt resistor 71 and feeds this arc current signal to an arc current error circuit 75. Arc current error circuit 72 compares the actual arc current with the arc current demand value and outputs a power supply control signal to control the arc voltage output by the arc power supply 61. The arc current demand signal is summed with the output of delatch circuit 90 for overall control purposes. An alternative approach of summing all of these control signals at a single input stage is shown below. However except when delatch circuit 90 is active, the control of the arc power supply 61 is entirely performed by the arc current error circuit 72. It has been discovered that fast changes in arc impedance within the arc chamber 15 can readily be accommodated by changing the arc voltage in response to the arc current error signal so that arc current can be maintained at a very stable value and very stable arc conditions will usually be achieved within the arc chamber.

It is necessary however to also provide for servo control of the arc voltage to maintain it substantially constant to avoid other instability conditions within the arc chamber which might occur due to changes in arc voltage. This is especially true under low arc current conditions and also at times when the filament 15B is nearing the end of its useful life. Control of the arc voltage to maintain it substantially constant is provided by a slow control loop implemented in a computer control system 75 which detects changes in arc voltage and executes a control loop program which alters the power demand signal to the filament power supply circuit to cause the power supplied to the filament to change in a direction which will inherently bring the arc voltage back to the demand value.

Control of filament power supply 60 is done through a power error circuit 76 which receives the power demand signal from the computer control system 75 and the actual power value from a power compute circuit 77. Power compute circuit 77 computes actual filament power from filament voltage on lead 78 and filament current on lead 79 as calculated by a filament current circuit 80.

The details of the control algorithm implemented in the computer control system are disclosed in software flowcharts included in the drawings and will be described in detail below. However, the basic principle of the control scheme involves comparing the actual arc voltage with the arc voltage demand and to use these inputs together with other inputs from the electronic control circuits to generate a new power demand signal which will change the filament power in a direction which will tend to raise or lower arc current so that, interactively, the arc current error circuit 72 will detect this gradual change in arc current and alter the arc voltage accordingly until it is back to the arc voltage demand level.

As will be discussed in more detail below, the arc voltage control mode, functioning under the control of computer control system 75, also provides for automated computer controlled startup of the ion source in a soft start routine which brings the source up to a relatively stable standard operating condition before switching over to arc current control mode for finally bringing the operation of the ion source to the arc current and arc voltage demand levels. The steps of this soft start control routine will be described in detail below.

FIG. 3 also illustrates schematically the general principles of a delatching system in accordance with this invention. The Aitken very high beam current technology utilizes a different beam extraction bias arrangement which incorporates a soft sparking feature. The pre-accel power supply 81 is a hard supply which produces up to twenty kilovolts of pre-analysis acceleration voltage to the ion chamber 15. Focus power supply 82 is a soft supply which provides up to a negative thirty kilovolts on the extraction electrode 13A. The decel electrode 13B is at terminal ground. Because of the large negative voltage on the extraction electrode 13A, and the softness of that voltage in terms of the low current generating capability of the focus power supply 82, any sparking between the arc chamber 15 and the extraction electrode 13A tends to be quickly extinguished because the voltage on the extraction electrode drops rapidly. While this quickly extinguishes the spark and makes it a soft spark in terms of its total energy, the reduction in the voltage on the extraction electrode 13A can also cause the ion beam to lose focus control so that the edges of the beam will begin striking the extraction electrode. When this occurs the beam can latch up in this condition due to the inability to recover the focus voltage even when the spark has disappeared.

The delatching circuit employs a current level detect circuit 83 which detects the amount of current being drawn by the focus power supply and produces a corresponding output voltage. This output voltage is compared with a reference voltage in a latchup detect circuit 84 which produces an output when the output of the current level detect circuit 83 exceeds the reference voltage value, indicating a latchup condition. This latchup signal is sent by way of the fiber optic transmitter 85 to a fiber optic receiver 86 to signal a delatch circuit 90 to send an output to the arc power supply which quickly pulses down the arc voltage to momentarily turn down the ion beam and thereby eliminate the beam latched condition. The delatch circuit 90 sends a status signal to computer control system 75 to advise of the latched condition so that changes in arc current and voltage during delatching may be ignored.

Figure 4:
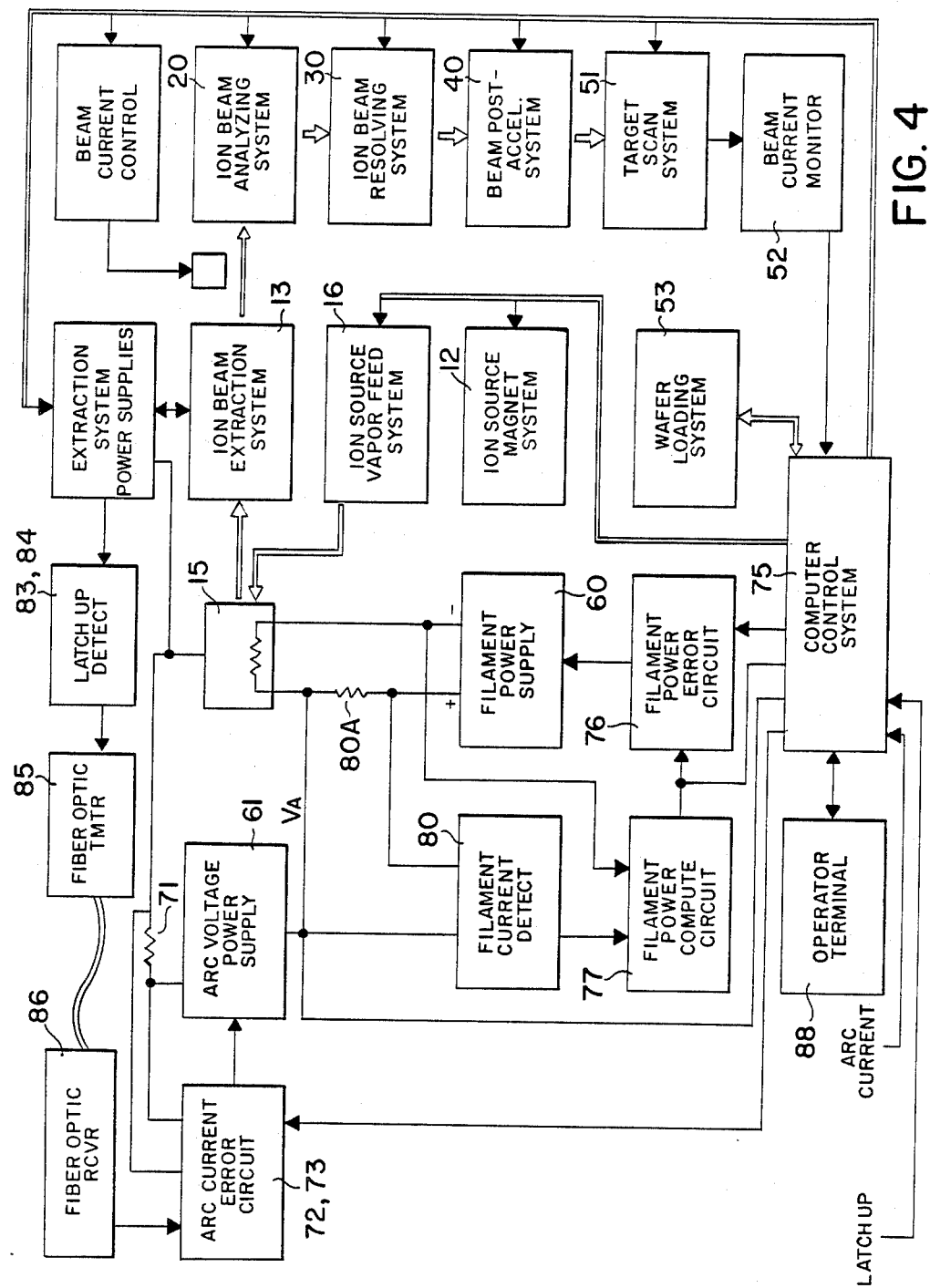
FIG. 4 is a block schematic diagram of an ion source control system integrated into a total ion implanter computer control system which is the preferred system embodiment for practicing this invention.

FIG. 4 together with FIG. 1 illustrates the manner in which the ion source control system and method and the dose measuring and control aspects of this invention may be integrated into an overall computer control arrangement for all of the subsystems of an ion implanter. It should be understood that the arc voltage control mode can be utilized in any ion implantation system which utilizes an ion source based on a heated filament and a filament-cathode to anode acceleration potential which basically has the same type of operating characteristics as the Freeman ion source. Thus the ion source control system and method can be employed in ion implanters of the prior art as well as in an ion implanter based on the Aitken very high current beam technology.

The preferred environment for use of the ion source control system and method of this invention is an advanced ion implantation system which utilizes beam line technology from the above-identified copending Aitken application and further utilizes, as the wafer target scan system 51 and the wafer loading system 53, the technology disclosed in the above-identified copending patent applications. These technologies together with the system and method for ion source control useful in this invention facilitate bringing all operational aspects of an ion implanter under control of a central computer control system 75.

It is well known to those familiar with ion implanter systems that setup of the various components and subassemblies of the system to perform an implant is a complicated process since many control parameters are involved. Furthermore, many of these control parameters interact with each other so that the setting of one control parameter affects others. For example, the preanalysis acceleration voltage applied to the arc chamber by the extraction system power supplies controls the ion beam velocity extracted from the arc chamber 15. Since the ion beam analyzing system 20 is a mass or momentum analyzer, the current supply to the electromagnets of the beam analyzing system must be controlled in terms of the ion energy entering the beam analyzing system so that ions of the desired chemical species are passed through the resolving system 30 into the post acceleration system.

Control of the overall ion source involves control of the ion source vapor feed system 16 (which may include a direct gas feed and ovens for vaporizing solid sources) and the ion source magnet system 12 as well as control of the electrical operating parameters of the filament-cathode and the anode/arc chamber 15. Since control over generation of the ions in the ion source lies at the very heart of the implanter system, achievement of effective computer control of the ion source itself is the foundation on which full automation of the entire implanter can be built. It has further been discovered that the ion source control system and method permits advanced implanter features such as automatic source tune-up under computer control to be realized. Using this invention, small beam currents can be controlled using small arcs rather than generating large currents and using vanes to reduce beam current to small values.

The implementation of computer control of components and subassemblies which are at high voltage potential can be achieved utilizing fiber optic transmission to local data acquisition units to thereby provide high voltage isolation between these sections of the system.

Figure 6:
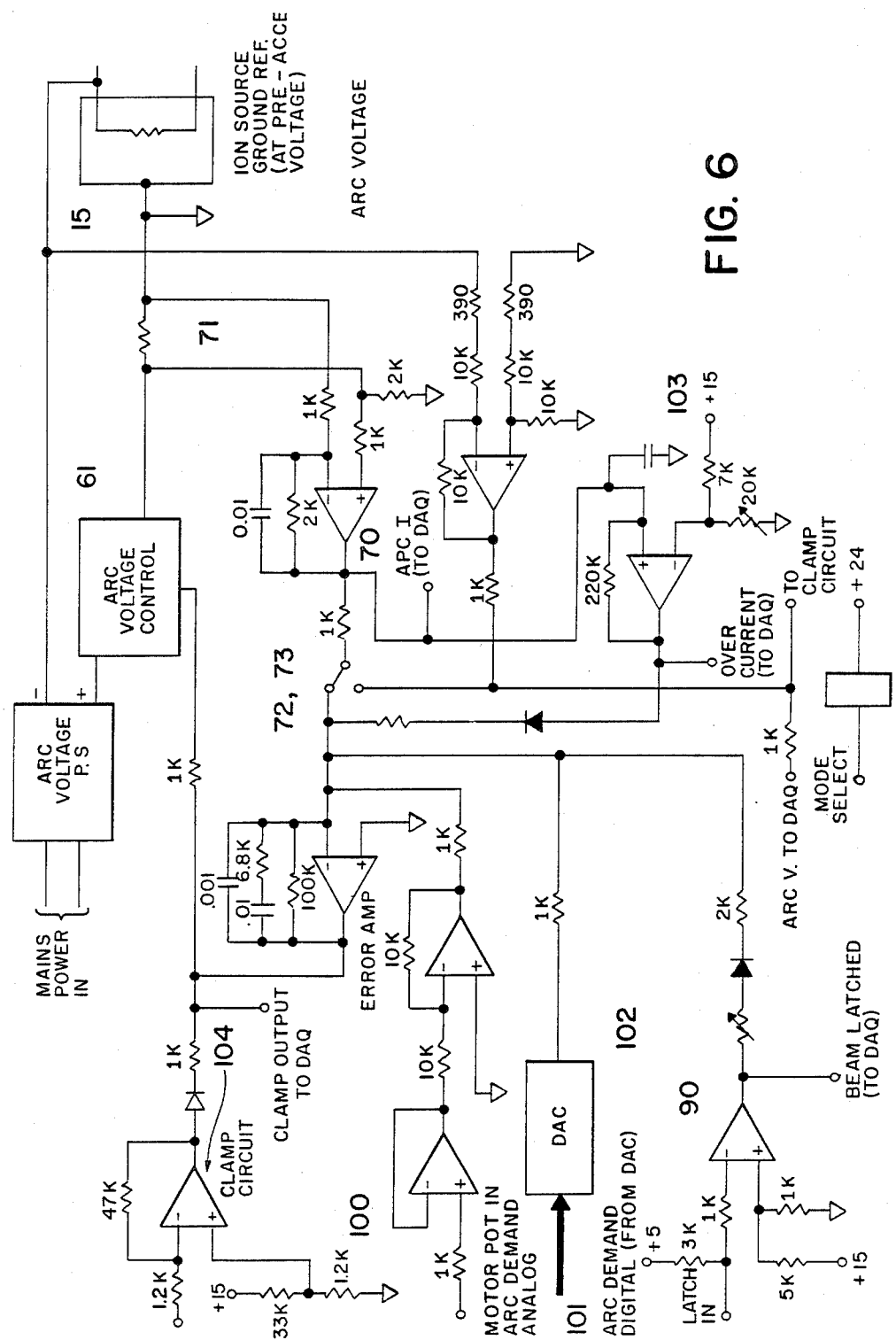

FIGS. 5 and 6 are partial circuit schematics which illustrate in more detail the circuit implementation of the electronic hardware portion. As shown in FIG. 5, the filament power control signal sent by the computer control system 75 to the filament power error circuit 76 is transmitted as a multibit digital control signal to the data acquisition unit associated with the filament power control system and a digital to analog converter 76A converts the digital signal to an analog signal for input to the filament power error circuit. It will also be seen in FIG. 5 that various analog signal values of filament current, filament voltage, filament power, filament power control and digital to analog converter output are fed back to the data acquisition unit, typically through appropriate signal coupling networks, so that the central computer control system 75 can monitor the control signal parameters and operating parameters for purposes of status checking and error analysis.

FIG. 6 illustrates in more detail the arc power supply and control circuits associated therewith. The version shown in FIG. 6 includes a mode relay for controlling whether the arc voltage or filament control mode is executed. It has been determined that the arc voltage control mode (i.e., arc voltage control of filament power with constant arc current) is superior over all ranges of arc conditions and thus the mode switch need not be provided.

As shown in FIG. 6, the arc demand analog signal is input on a terminal 100 as the output of a motor potentiometer circuit which is set under computer control. Since this arc demand signal is typically set once and does not require fast alteration, motor potentiometer control is satisfactory. This contrasts with the rapid digital control signal communication of a new power control signal from the computer into the filament power supply control circuit shown in FIG. 5. However, under certain circumstances it may be desirable to also be able to rapidly change the arc demand signal. Consequently, a separate provision is made for communicating an arc demand digital signal component via digital input lines 101 to a digital to analog converter 102 whose output is summed with the motor pot analog demand signal at the input to the overall error circuit 72, 73.

It will be appreciated that several different circuit approaches to the error amplifier can be implemented. The analog input signal summing arrangement shown in FIG. 6 simplifies the overall error circuitry in view of the number of different input analog signals to be utilized in the overall final arc voltage control signal. The delatch circuit 90 receives a latch in signal and couples that signal at an appropriate analog level to the summing input of the error amplifier circuit to temporarily override any other input control voltages to perform the beam delatching function. A hardware overcurrent protect circuit 103 is also included in the hardware control system. This overcurrent circuit provides a hardware clamp on arc current so that dangerously high arc currents cannot be called for.

A hardware undervoltage clamp circuit 104 is also provided to prevent the arc voltage from being lowered to the point that the arc may be extinguished. The undervoltage clamp circuit starts to come on at about 21 volts of arc voltage and clamps hard at about 17 volts of arc voltage output.

The manner in which the circuitry of FIGS. 5 and 6 operates under control of the central computer control system 75 as shown in FIG. 4 will be apparent from the description of the software control routines given below.

Figure 7:
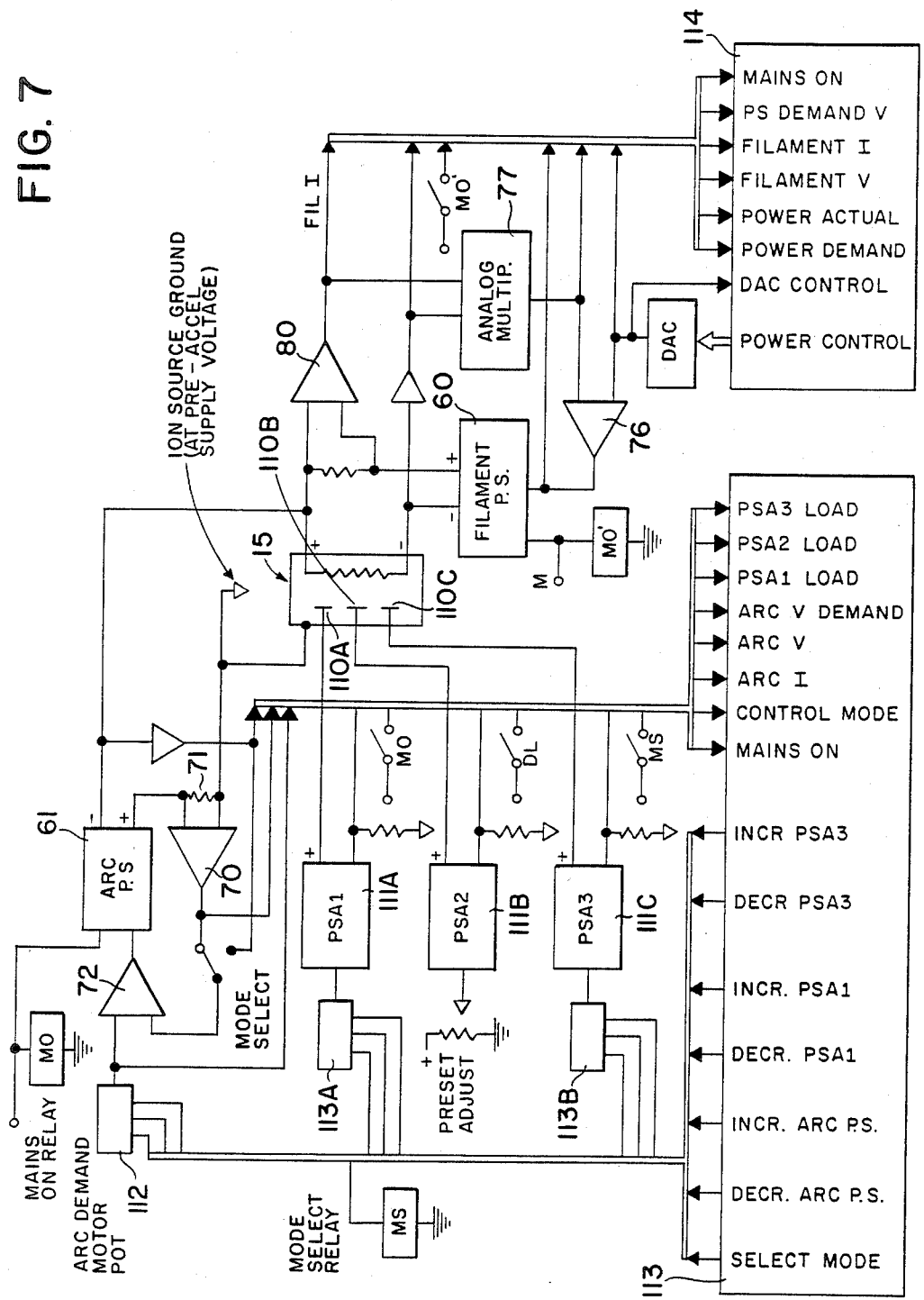
FIG. 7 is a block schematic diagram illustrating the ion source control system and communication of control and operating parameters to and from a computer system.

FIG. 7 illustrates in somewhat greater detail the input and output signals which are communicated via data acquisition units to the filament control system and the arc power supply control system. In particular, FIG. 7 illustrates that the ion source control system is preferably implemented in an ion source of the type disclosed in the above-referenced Aitken patent application which utilizes a split anode arrangement with each of the separate anode sections 110A, 110B and 110C being coupled to separately programmable power supplies 111A, 111B and 111C for purposes of controllably modifying the plasma distribution in the ion source chamber and to compensate for field modification effects produced by the voltage applied across the filament.

Motor pot 112 is controlled via the DAQ system 113 which may involve one or data acquisition modules and separate motor pots 113A and 113C are operated to control the individual anode section power supplies 111A and 111C, with anode supply 111B being preset. A separate data acquisition mode 114 is used to communicate with the filament power supply control board and has basically the input and output signals indicated.

Software Control Routines For Ion Source Control

Figure 8:
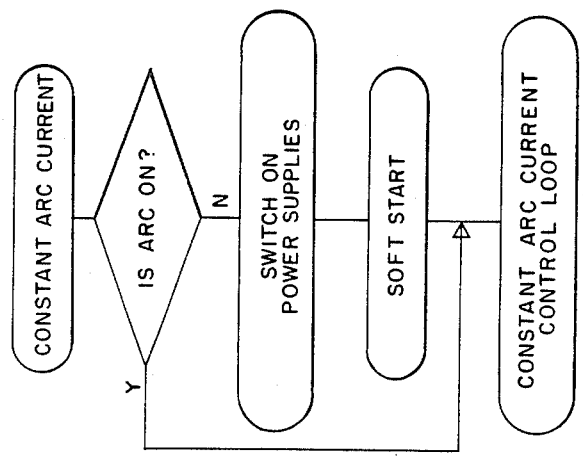
FIG. 8 is a diagram of the main software routines utilized in an ion source control system useful in this invention.

FIG. 8 illustrates the basic software routines involves in a constant arc current mode of controlling the Freeman type ion source useful in this invention. Since the constant arc current routine can be entered when the arc in the arc chamber is already on, the first test performed is to determine whether the arc is on or not. If the arc is on, the system directly enters the constant arc current control loop routine. If the arc is not on, the first routine performed is one to switch on the arc voltage power supply and the filament power supply. After this switch-on routine has been performed a soft start routine is performed to initiate an arc in the arc chamber in a well-controlled manner. If the soft start routine is successful, the constant arc current control loop is entered.

The routine to switch on the power supplies is relatively simple and need not be discussed in any detail here. Basically the routine starts by making sure the Freon coolant is turned on to the arc chamber and the dummy load resistor relay at the output of the arc power supply is off. A one amp current demand is set into a data structure and then the arc current motor pot is adjusted to this stored demand value. Thereafter, the mains power is switched on to the arc power supply, a timer is set and a control loop entered to check whether the mains has actually turned on prior to timing out of the timer.

A similar routine is used to turn on the filament power supply. Filament power demand is set at a minimum value, for example 120 watts, and then the power mains input to the filament power supply is turned on. A similar timer and checking loop is used to determine whether the mains to the filament power supply turns on within a predetermined time. Thereafter the system checks to determine that the filament supply is actually on.

Under these operating conditions, it is not expected that any arc will be struck so there will be no arc current. Since there is no arc current actually flowing but arc current demand has been set at one amp, the error circuit in the arc voltage control system will cause the arc voltage to go up to its maximum value of about 140 volts. At this voltage there will still be no arc struck because the filament power is not sufficient to initiate the arc.

Figure 9:
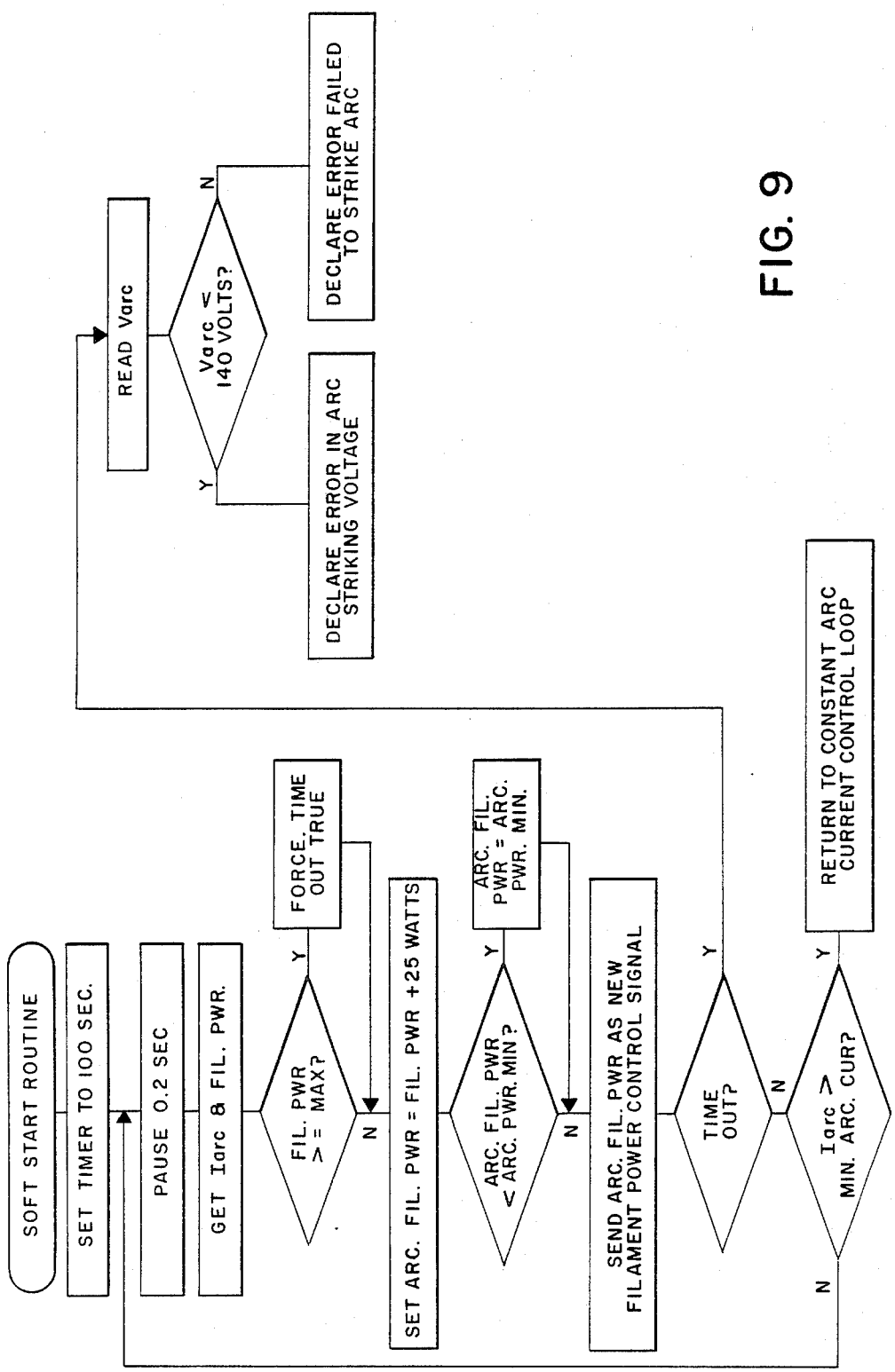
FIG. 9 is a software flow diagram for a soft start software routine useful in this invention.

Assuming the power supplies have been successfully turned on, the software enters the slow start routine shown in FIG. 9. The basic function of the slow start routine is to slowly ramp up the filament power in small increments until an arc is struck and minimum arc current is flowing. This result must be achieved before a timer times out and before filament power is ramped up to the maximum permitted filament power.

The actual steps in the slow start routine will now be described with reference to FIG. 9. The first step is to set a timer to 100 seconds as the maximum time permitted for successful striking of an arc. The routine passes for 0.2 seconds and then gets the values of the arc current and the filament power via the DAQ communication system as previously discussed.

Next a test is performed to determine whether the filament power is greater than or equal to the maximum permitted filament power. If it is, the timeout value is forced TRUE so that the routine will later exit and not loop around. The next step is to set the arc filament power (ARC.FIL.PWR) value, i.e. the value to be demanded for arc filament power to be equal to the actual filament power plus an incremental 25 watts. The 25 watt increment is a convenient value which has proven to be practicable but other incremental values in about the same range could be utilized.

Figure 10:
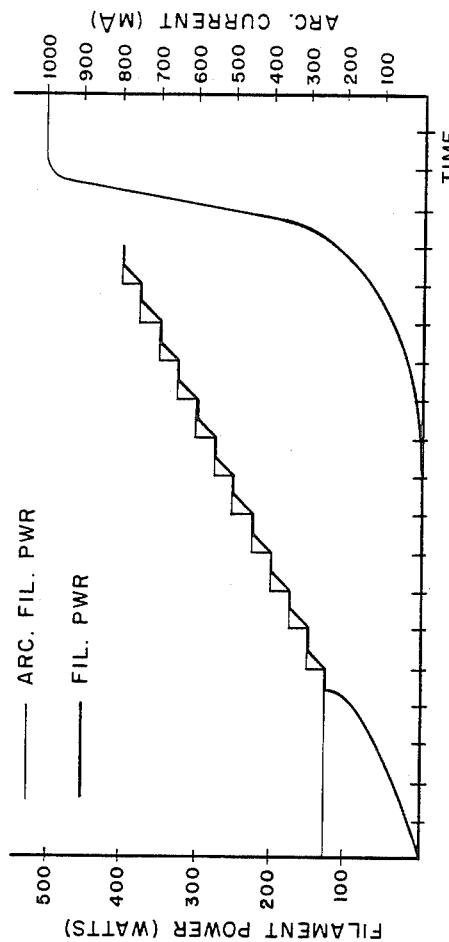
FIG. 10 is a diagram useful in illustrating the operation of the soft start routine of FIG. 9.

The system next determines whether this new arc filament power demand value is less than the arc power minimum value (e.g., 120 watts) already set into the filament control system during the supplies turn on routine. If it is, the arc power minimum value is maintained unchanged. Referring to FIG. 10, it can be seen that the arc filament power signal remains at the 120 watt value initially set until a new value overrides it. The ARC.FIL.PWR demand signal is sent via the DAQ to the filament power control circuit as the new filament power control signal. The system then checks to see whether a timeout has occurred. If the timeout has occurred, the system then goes off to a branch which determines what type of error occurred in striking the arc. This will be discussed below.

If timeout hasn't occurred, the system then tests to determine whether the value of arc current is greater than the minimum arc current value which has been established by experience to be a value which signals that an arc has been successfully struck. This value may, for example, be 100 mA as shown in the diagram of FIG. 10. If this test returns a negative, as it will be during the first few loops through the slow start routine, execution of the routine branches back to the pause step and re-executes. Under normal circumstances, after some number of loops through the main routine, an arc will be struck and the arc current will rise above the minimum arc current value and software control will be returned to enter the constant arc current control loop.

If a timeout has occurred, the routine executes the step of reading the arc voltage and then testing to see whether it is less than the maximum arc voltage of 140 volts. If the arc voltage is less than the maximum 140 volts, the error declared is in the arc striking voltage itself. If the arc voltage is at the maximum of 140 volts, the error declared is that the arc simply failed to strike. With one or the other of these machine errors declared, the user will be signaled that some problem has occurred and an attempt to locate the problem ca thereafter be made.

Figure 11:
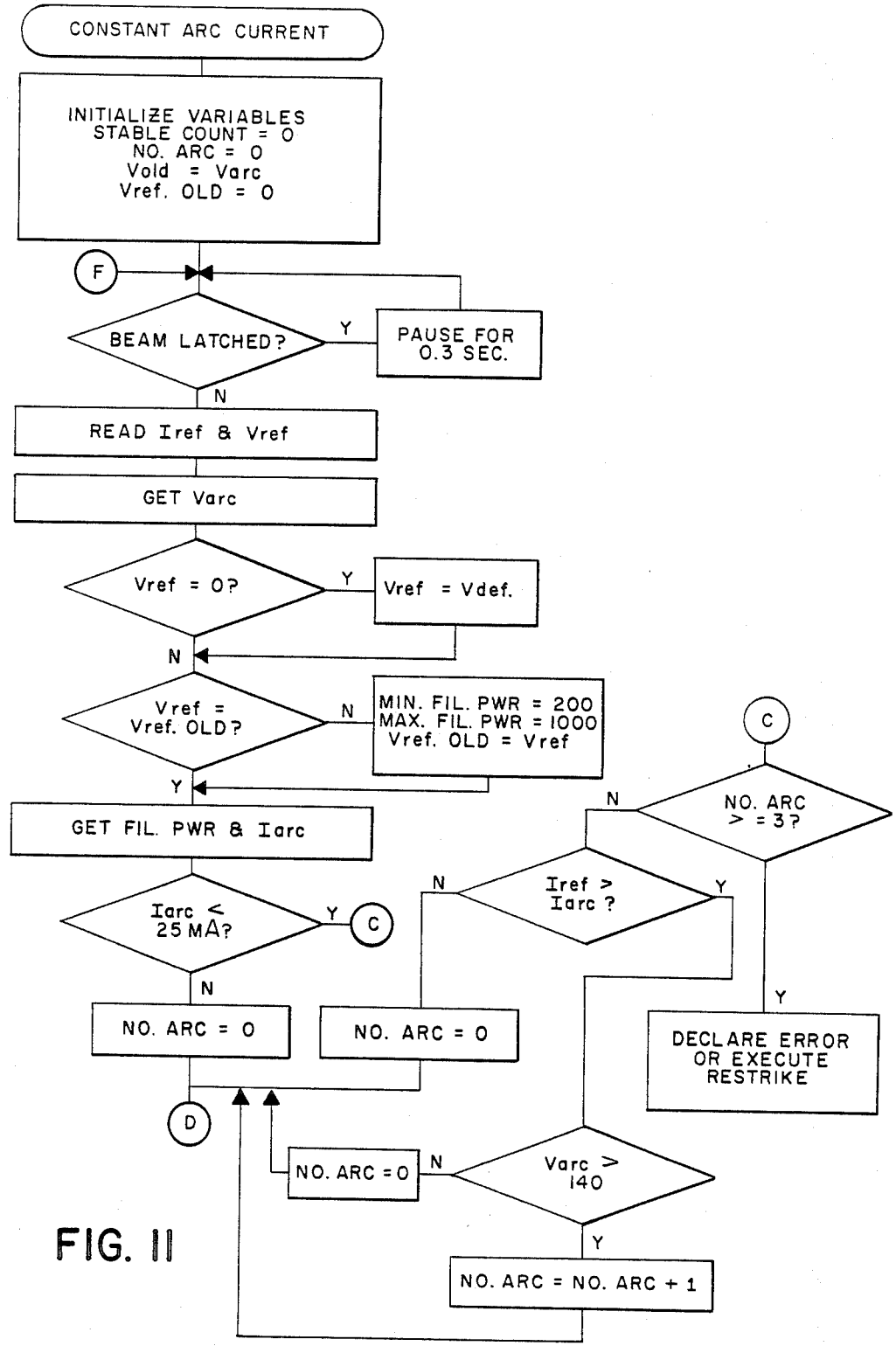
FIGS. 11–13 are software flow diagrams of a constant arc current control loop software routine useful in this invention.
Figure 12:
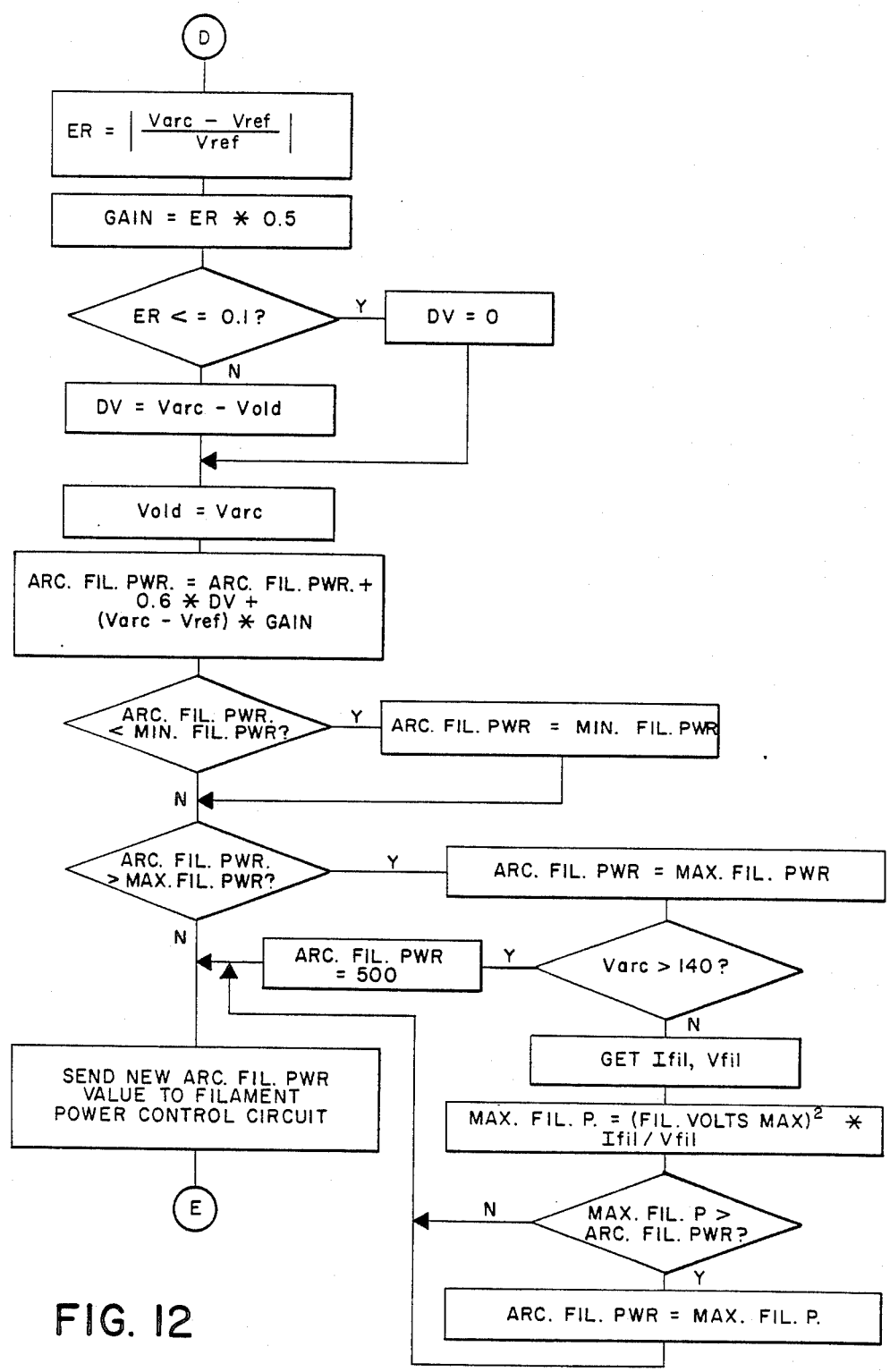
Figure 13:
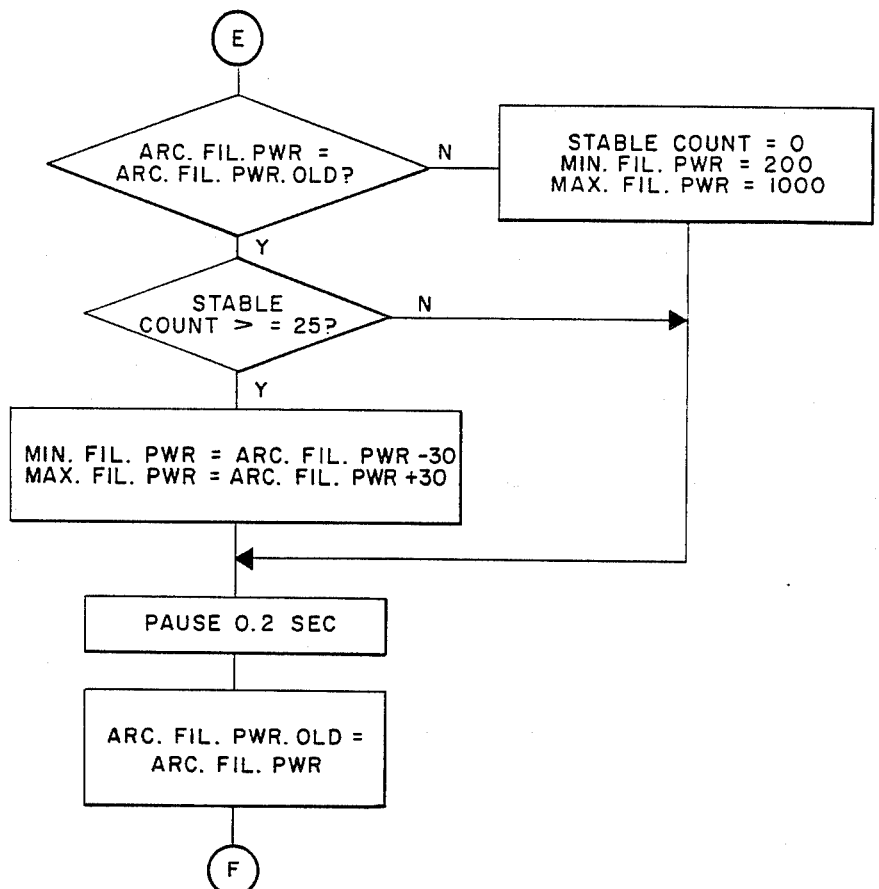

Assuming that the slow start routine has successfully started an arc in the arc chamber, the constant arc current control loop takes over to bring both the arc voltage and arc current to the user-defined or machine-defined values and thereafter to maintain the arc voltage at a substantially constant value utilizing a slow software-based servo loop which basically looks to detect a change in the arc voltage and to correspondingly change the arc filament power to bring the arc voltage back to the demand value. The constant arc current control loop routine is illustrated in FIGS. 11–13 which will be described in conjunction with the graph shown in FIG. 14. The constant arc current routine begins by initializing certain variables utilized in the routine. The STABLE COUNT variable is set to zero as are the NO.ARC and Vref.OLD variables. The value of the Vold variable is set to the current voltage value:Varc read from the circuitry.

After the variables have been initialized, the routine first tests to see whether the ion beam is in a latched condition. It does this by looking at a data structure flag which is written each time the beam latches. If the beam is in a latched condition, the routine branches off for three-tenths of a second and then checks again to see if the beam is still latched.

If the beam-latched test is negative the system reads in the demanded arc current Iref and the demanded arc voltage Vref. These values will be stored in internal data structures within the computer. The system then gets the value of the arc voltage Varc via the appropriate DAQ.

The next step performed is to determine whether the demand arc voltage Vref has been set to a zero value, which is not realistic. If such a value has been set the Vref value is reset to a default value Vdef and execution continues. The next step is to test whether the value of Vref is equal to the value of Vref.OLD. It will be remembered that Vref.OLD was initialized to zero as the first step in the program, so the first time through the loop, this test will be negative. This causes the program to set MIN.FIL.PWR equal to 200 watts, MAX.FIL.PWR equal to 1000 watts, and to set Vref.OLD equal to Vref. In subsequent loops through the routine Vref will equal Vref.OLD unless a new Vref value has been set into the data structure either by the user or some automatic source tuning routine.

The system now goes out and gets the values of FIL.PWR and arc current Iarc. Next the Iarc value is tested to see if it's less than 25 mA. This 25 mA value is one that has been preselected as a practicable value to use as a test whether the arc may be out under some conditions. It is not a final test since there are circumstances under which the arc current demand may be set at less than 25 mA. However, in most operating situations higher arc current will be demanded and the arc will probably be out if the arc current value is below 25 mA. If this test is positive the system branches off to special routines to deal with that situation. These routines will be described below.

Temporarily it will be assumed that this test returns a negative and the NO.ARC variable is then set to zero. The system now enters the actual software-based servo loop which will determine first whether there is an error in arc voltage and, if there is an error, an appropriate change in filament power will be signaled in the direction which will tend to correct the error.

The first step in this routine is to calculate a fractional error ER as the absolute value of the difference between Varc and Vref divided by Vref. Next the integral gain constant is set equal to the fractional error ER times a preset gain constant value of 0.5 which has been empirically determined to give good results. The system then determines whether the fractional error is so small that it can be ignored for purposes of a differential gain factor in the final change in ARC.FIL.PWR. The system tests whether than ER is less than or equal to 0.1. If it is, the differential variable DV is set to zero. Otherwise, the differential variable DV is set to a value equal to Varc minus Vold. Since Vold is next set to be equal to Varc it will be seen that the differential variable has a value equal to the amount the arc voltage has actually changed since the last time the loop was executed. Since the loop execution interval is relatively constant, DV is a measure of how fast the arc voltage is changing.

The program now calculates a new ARC.FIL.PWR demand value by incrementing the old ARC.FIL.PWR demand value by both a differential term and an integral term, both of which may have zero value if the arc is stable. The differential term involves multiplying a derivative gain constant value (0.6 in this case) by the change in arc voltage produced by the last change in filament power. The integral gain factor has a value based on the distance that the arc voltage is away from the actual demanded arc voltage. The differential and integral gain factors will have different signs.

The system then goes into a checking routine to see whether it makes sense to use the new ARC.FIL.PWR value calculated. It first tests whether the new ARC.FIL.PWR value is less than the MIN.FIL.PWR value. If that test is affirmative, ARC.FIL.PWR is set to the minimum value rather than use the calculated value. This precludes setting a new ARC.FIL.PWR value which could cause the arc to go out. Next a test is performed to determine whether the new ARC.FIL.PWR value is greater than the MAX.FIL.PWR value. If this test is negative, the new ARC.FIL.PWR value is sent via the DAQ to the filament power control circuit to move the filament power in a direction which will tend to correct the error in arc voltage.

If the ARC.FIL.PWR value is greater than the MAX.FIL.PWR value, the program sets the ARC.FIL.PWR value equal to the MAX.FIL.PWR value and then tests to see whether the Varc value is greater than the minimum arc striking voltage of 140. If this test is satisfied, the arc is in a highly unstable condition. Therefore, to try to recover a stable condition, or at least to prevent burnout of this filament, the arc filament power is set at a maximum of 500 watts. If the above-stated condition is not satisfied, the system calculates the maximum power the filament is capable of taking MAX.FIL.P using the resistance value Ifil/Vfil multiplied by the square of the value of the maximum voltage deliverable by the filament power supply. The system then tests to see of the value of MAX.FIL.P is greater than the ARC.FIL.PWR (which was set to MAX.FIL.PWR). If it is greater, then the ARC.FIL.PWR is set to the MAX.FIL.P value. If it is not greater, the ARC.FIL.PWR value remains at MAX.FIL.PWR. At this time the ARC.FIL.PWR value is sent to the filament power control circuit as the new power demand signal.

Figure 14:
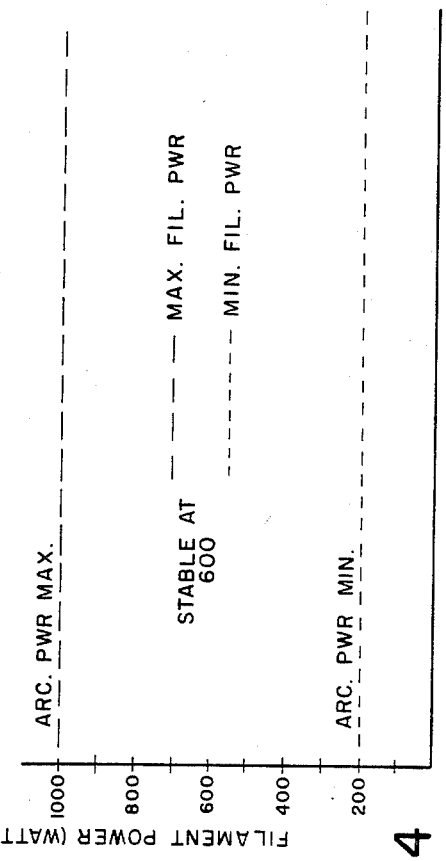
FIG. 14 is a chart useful in explaining a portion of the constant arc current routine shown in FIGS. 11–13.

At this point the program performs a check to determine whether the arc is and has been in a very stable condition and, if it has, it narrows the MAX.FIL.PWR-MIN.FIL.PWR band to plus and minus 30 watts offset from the current ARC.FIL.PWR value as shown in FIG. 14. Specifically the program first tests whether the ARC.FIL.PWR value is equal to the ARC.FIL.PWR.OLD value. If this test return a NO, the program sets the STABLE COUNT variable to zero, sets the MIN.FIL.PWR to 200 watts and the MAX.FIL.PWR to 1000 watts. If the test returns a YES, the system then tests whether the STABLE COUNT value is greater than or equal to the stable threshold parameter which has been selected to be 25. If the STABLE COUNT is greater than or equal to 25, MIN.FIL.PWR is set equal to ARC.FIL.PWR −30 and MAX.FIL.PWR is set to ARC.FIL.PWR +30. These values will preclude large changes in the next ARC.FIL.PWR calculation during the next time through the loop. This is based on experience that, if the arc has been stable for some time, a condition which makes it look unstable may be a temporary phenomenon such as a small flake falling into the source and temporarily shorting out the arc or a beam latching condition. At this point the program pauses for 0.2 seconds to allow whatever change in arc filament power demand has been made to take effect. It then sets the ARC.FIL.PWR.OLD value to the current ARC.FIL.PWR value to use the next time around the loop and then the program loops back to the beginning to re-execute.

Now going back to FIG. 11 where the test was performed to determine whether the value of Iarc is less than 25 mA, if this test returns a YES value, the system first tests to see whether the NO.ARC variable is greater than or equal to 3. In other words, the system is given three times through the loop to recover itself from what appears to be a no arc condition. If that test returns a negative, the next step is to test whether Iref is greater than Iarc. If Iref is not greater than Iarc, this means that Iarc has been set at a value less than 25 mA and the arc is not out. Consequently the value of NO.ARC is set to zero and the programs continues its execution at point D. If the test for Iref greater than Iarc returns a YES, the system tests to see if the Varc value is greater than or equal to the minimum arc striking voltage of 140. If that test returns a NO, it means the arc has not gone out and NO.ARC is set to zero. If that test returns a YES, the NO.ARC value is incremented by 1.

It will be seen that, if this test for the arc having gone out is positive three times through the loop, then the NO.ARC greater than or equal to 3 tests will be satisfied and the program will treat the system as having a NO.ARC condition. Depending on various optional settings either an error will be declared or an arc restrike routine will be executed.

The Preferred Wafer Scanning System

Figure 15:
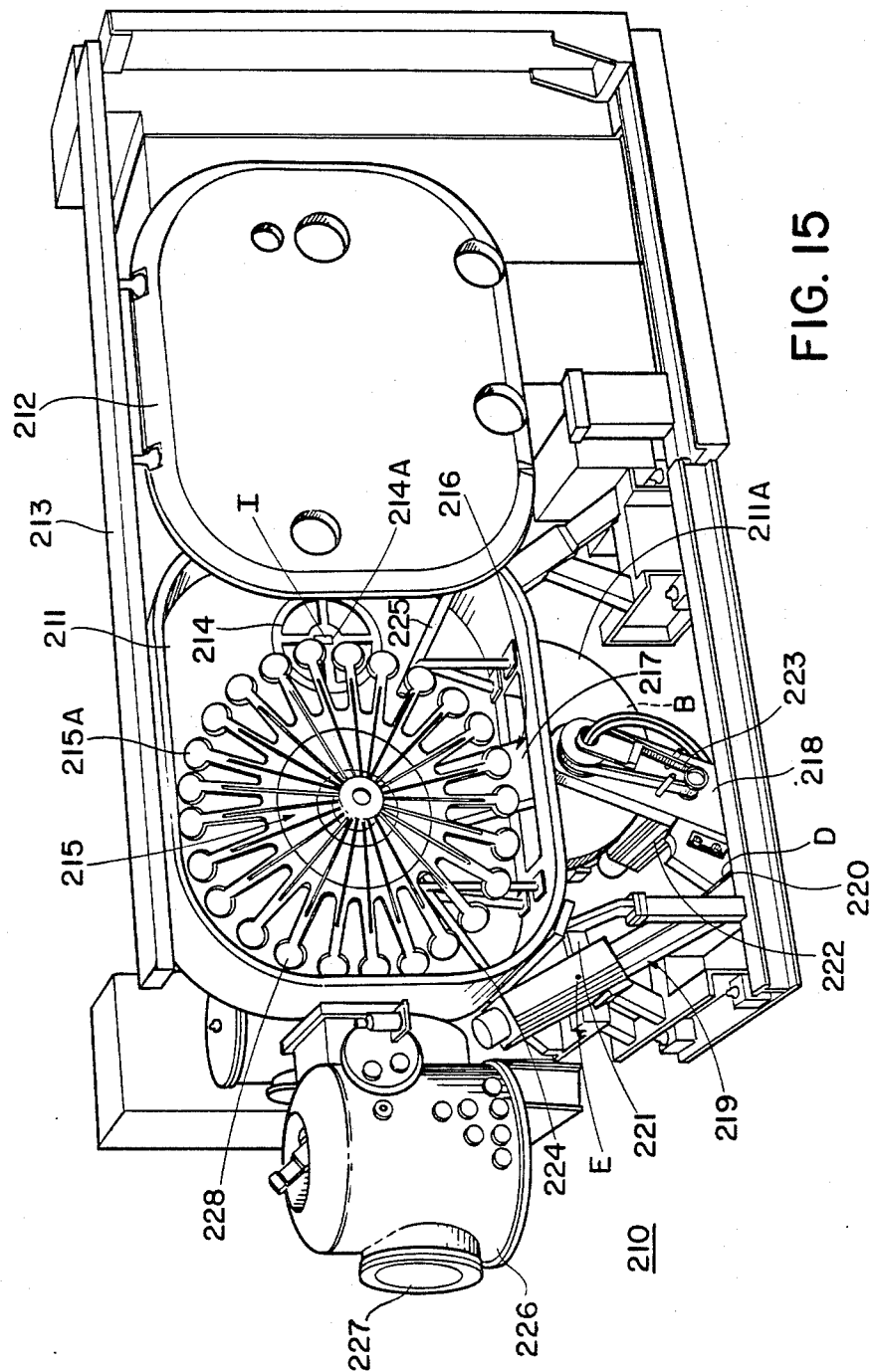
FIG. 15 is a perspective view of a wafer scanning system useful in conjunction with this invention.
Figure 16:
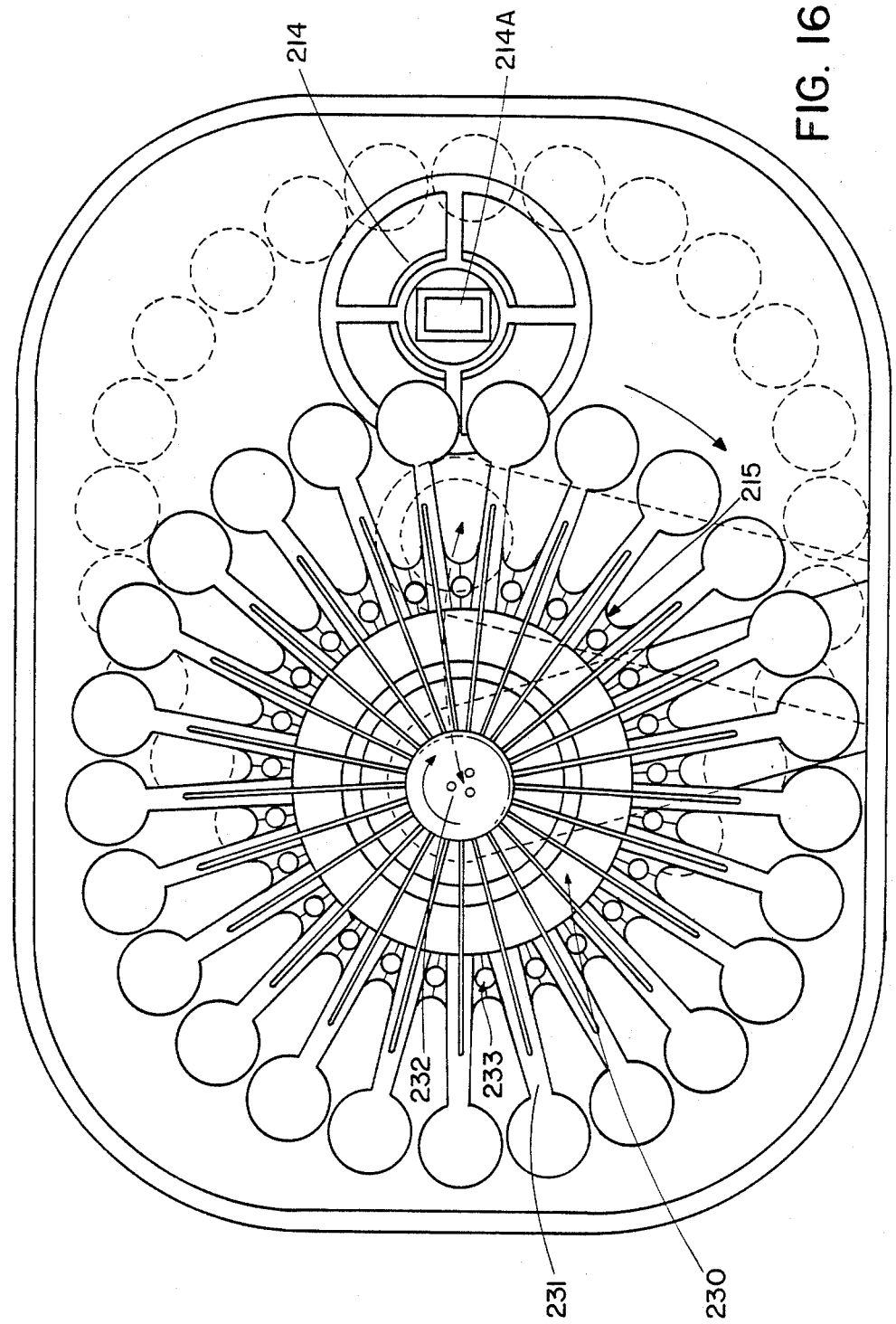
FIG. 16 is an elevational view of a wafer scan wheel assembly useful in conjunction with this invention.

The preferred wafer scanning system for implementing the method of this invention is depicted in FIGS. 15 and 16.

FIG. 15 depicts an ion implantation system 210 which includes a wafer process chamber 211 having a sliding front door 212 carried on an overhead track 213 and having sealed view ports therein. When slid into position over the chamber 211, the door 212 completes a vacuum chamber. Appropriate vacuum seals and gripping arrangements (not shown) hold the door 212 tightly against the side walls of the process chamber. Vacuum pumping apparatus (not shown) communicates with the interior of vacuum chamber 211 to pump down the chamber and provide the evacuated atmosphere required for effective ion implantation. Preferably the wafer processor chamber is pumped with one cryopump system and the post-acceleration system is pumped with a separate cryopump having special hydrogen gas pumping capability and a differential pumping box is preferably formed around the post acceleration electrodes so that this cryopump will maintain good vacuum conditions in the post acceleration region of the chamber.

An ion beam generating and analyzing system communicates an ion beam to the vacuum chamber through a post-acceleration system 214 which extends through the back of the vacuum chamber 211 as shown in FIG. 1. The ion beam generating and analyzing system is preferably the one shown in the above referenced Aitken patent.

A scan wheel assembly 215 is mounted within the vacuum chamber 211. The scan wheel assembly 215 includes twenty-five wafer mounting paddles 215A arranged in a circular array around a central hub. The details of the scan wheel assembly will be described below. Scan wheel assembly 215 is mounted for high velocity rotation about its central axis and for rotational precession about an axis at the bottom of the scan arm assembly 217 which extends into a well 211A at the bottom of the vacuum chamber.

A mounting and drive arrangement 216 mounts the scan wheel assembly 215 in the vacuum chamber 211 and includes the various mounting arrangements and drive arrangements for accomplishing the dual rotational and precessional scan of the scan wheel assembly. The main elements of the mounting and drive arrangement 216 are scan arm 217 which is directly coupled to drive arm 218, which is driven by a motor and lead screw drive arrangement 219. A ball type coupling 20 couples the drive arm 218 to the translating carriage (not shown) of lead screw drive arrangement 219. Drive arrangement 219 is mounted for rotation to a bracket 221. A motor 222 mounted to the drive arm 218 drives a belt drive transmission arrangement 223 which includes a belt drive arrangement (not shown) mounted within hollow scan arm housing 217 to provide the drive for rapid rotation of the scan wheel assembly 215.

Stop brace assemblies 224 and 225 mounted within the vacuum chamber 211 limit the precessional scan position of the scan wheel assembly 215 when the drive arm arrangement 218 is decoupled from the lead screw drive arrangement 219.

A wafer handling and loading arrangement is provided within a separate chamber 26 which includes a load lock door 27 for convenient interfacing to a wall of a semiconductor process clean room. The wafer loading system includes an arrangement for transferring wafers to and from a heat sink paddle located at the position designated 28 to a standard wafer cassette. A preferred form of wafer handling and loading arrangement is disclosed in copending and commonly assigned Stonestreet et al. U.S. patent application Ser. No. 774,209, filed Sept. 9, 1985, and entitled "Systems and Methods for Wafer Handling in Semiconductor Process Equipment."

FIG. 16 shows certain structural details of the scan wheel assembly 215. Scan wheel assembly 215 comprises a central hub assembly 230 which carries thereon a plurality of separate heat sink assemblies 231 and a cooling fluid supply arrangement 232. Mounting arrangements 233 mount the individual heat sink assemblies 231 to the back plate 234 of the hub assembly 230. Hub assembly 230 is mounted for rotation about its central axis A by a combined shaft, bearing and rotary vacuum seal arrangement 240 which provides for rotation of the scan wheel assembly relative to the scan arm assembly 217.

Further structural and functional details of this wafer scanning system are described in the co-pending and commonly assigned patent application of Robinson et al, Ser. No. 774,192, filed Sept. 9, 1985, and entitled "Systems and Methods for Ion Implantation of Semiconductor Wafers." This invention is not limited to use in conjunction with this preferred form of wafer scanning apparatus, but could be used with other forms of wafer scan wheels. The feature important to this invention is that the wafer scan wheel have a single circumferential arrangement of wafers carried thereon and that the wheel and the wafers carried thereon be positioned totally out of the path of the ion beam at the end of each of the slow scan motions of the wafer scan wheel. This is the position of the wheel shown in FIG. 16.

Figure 17:
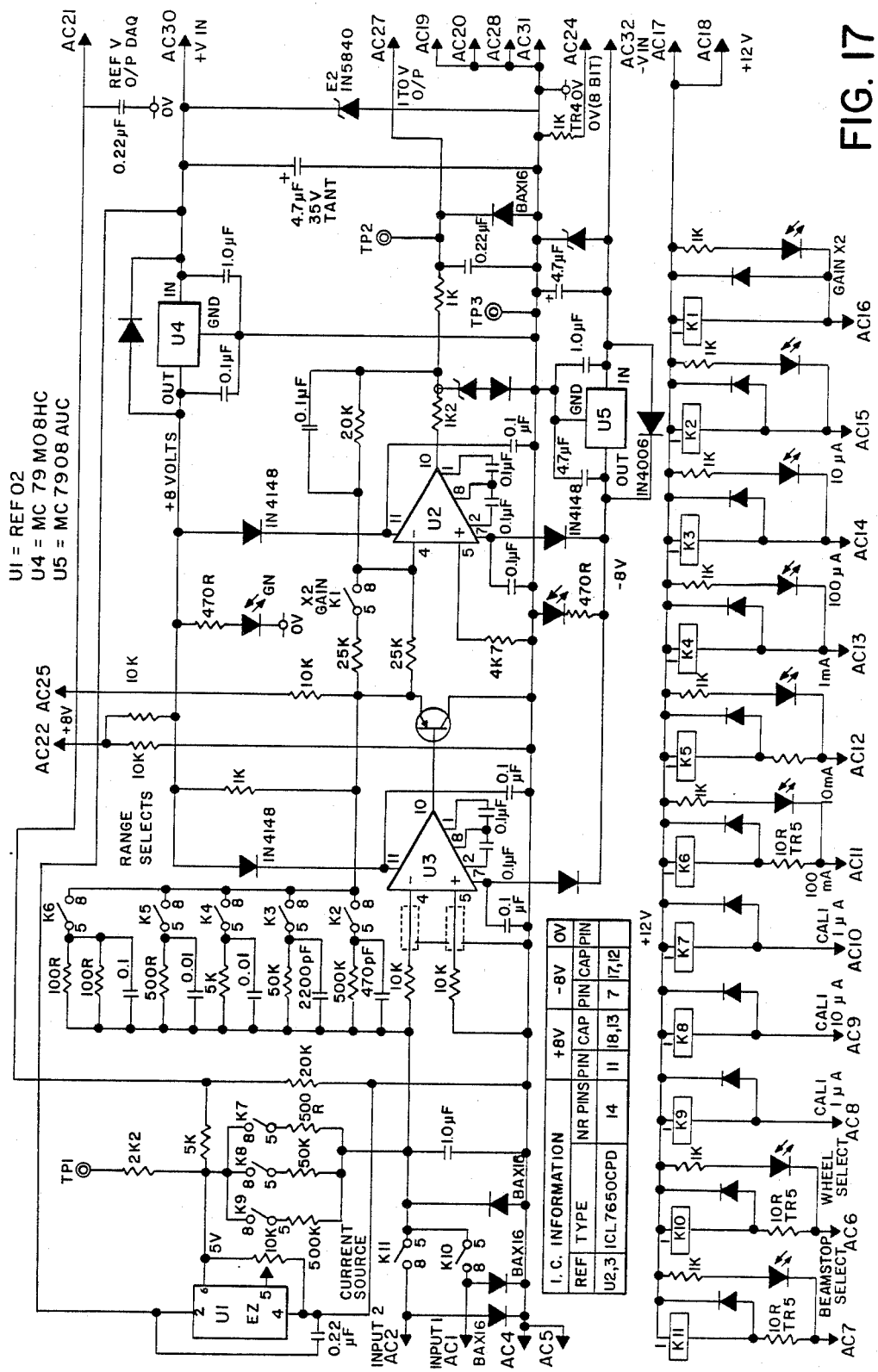
FIG. 17 is a circuit schematic diagram of a current to voltage converter circuit useful in conjunction with this invention.

FIG. 17 illustrates a form of current to voltage converter which may be employed in a system to implement this invention. Other forms of this circuit could also be used. The circuit shown in FIG. 17 includes range setting capability using a plurality of relays operated from dedicated data acquisition signal lines so that the computer control system can set the measuring range of the circuit for best measurement accuracy based on the range of current that is being sensed on the beam stop. The voltage signal output of the current to voltage converter is sent to an analog to digital converter to produce a digital data word which is sent to the computer control system for processing in calculation and control routines. The details of the operation of this circuit are not important to this invention and will not be described here.

Dose Measuring and Control Software Routines

FIG. 18 illustrates the general methodology for dose measurement that is central to this invention. It is assumed for this explanation that an ion beam has been generated and has been directed toward the target wafer in the system and that the scan wheel has been brought up to speed in the fast scan motion.

The first step is to measure the beam current on the beam stop as the start current. This is done with the wheel completely out of the beam and is followed by starting the slow scan of the scan wheel. Then the slow scan is continued until a checking step determines that the scan is complete and the wheel is totally out of the ion beam. The flood gun, if present, is then turned off and this is followed by measuring the beam current on the beam stop as the end current. Also, if gas injection into the region in front of the wafer is being used, this gas is turned off so that it will not cause neutralization of some of the ions in the ion beam. The average beam current is then calculated as one-half of the sum of the start current measurement and the end current measurement just completed. From the average current the cycle dose can be calculated and the cumulative dose can be determined by adding the cycle dose to the previously calculated cumulative dose.

FIG. 19 illustrates the general steps involved in performing a two-step implant on wafers covered with a photoresist layer. First the beam current is set to a no beam harm level. This means that the current level is such that the beam striking the wafer does not produce a volume of gas that affects the current or energy integrity of the ion beam. Then a first implant cycle is run, typically involving a set number of slow scan cycles, and the dose measurements are cumulated. This first cycle runs until the photoresist layer is conditioned to produce less outgassing under high beam current. Then the beam current is set to the final higher current value level and a second implant cycle is run to achieve the final implant dose level. The ability to accurately measure each scan cycle dose and to control the entire functioning of the beam line under computer control makes it possible to implement this two step implant and thus to achieve higher efficiency of implant than would be achieved if the entire implant had to be run at the initial no harm current level.

AUTO.IMPLANT ROUTINE

Figure 20A:
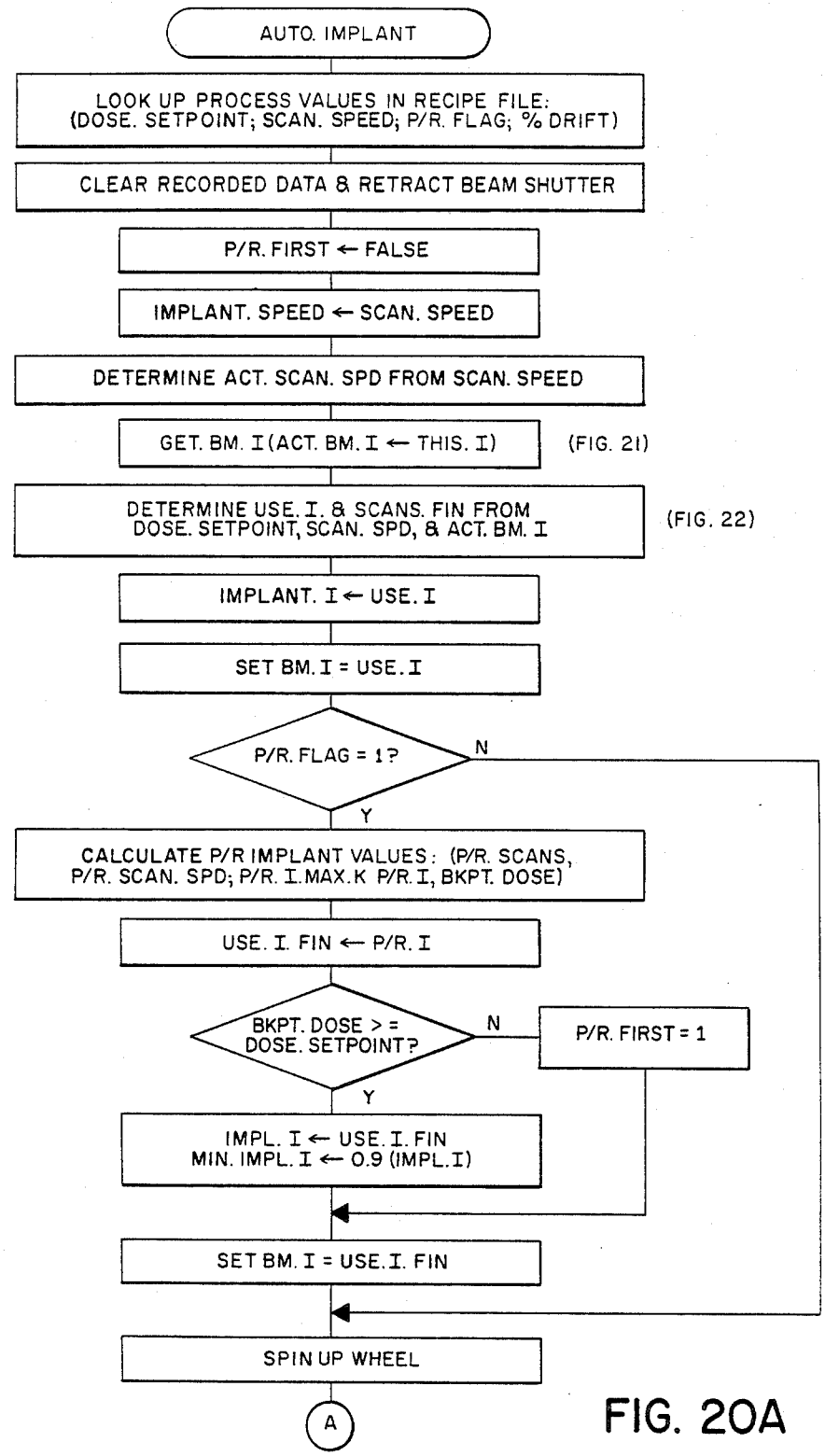
Figure 20B:
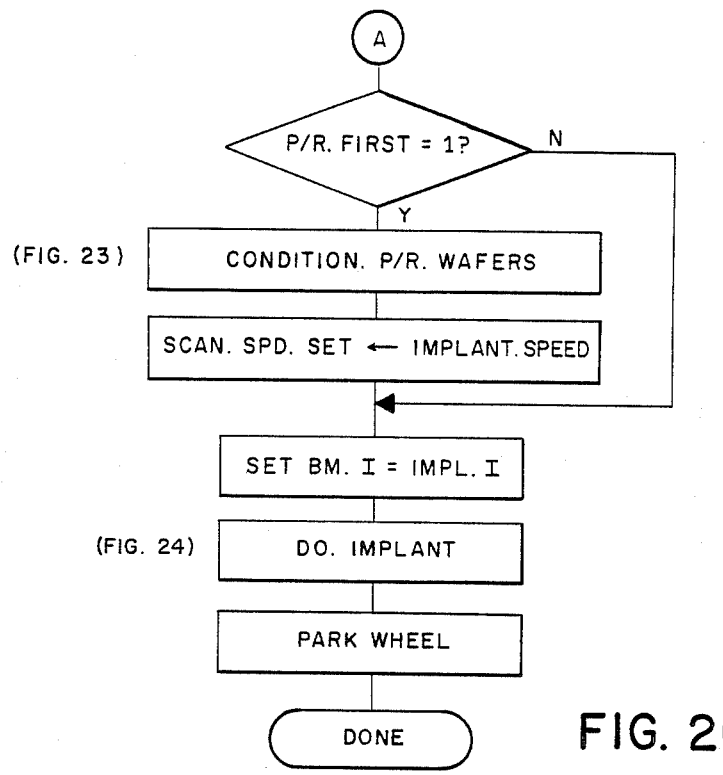
Figure 21:
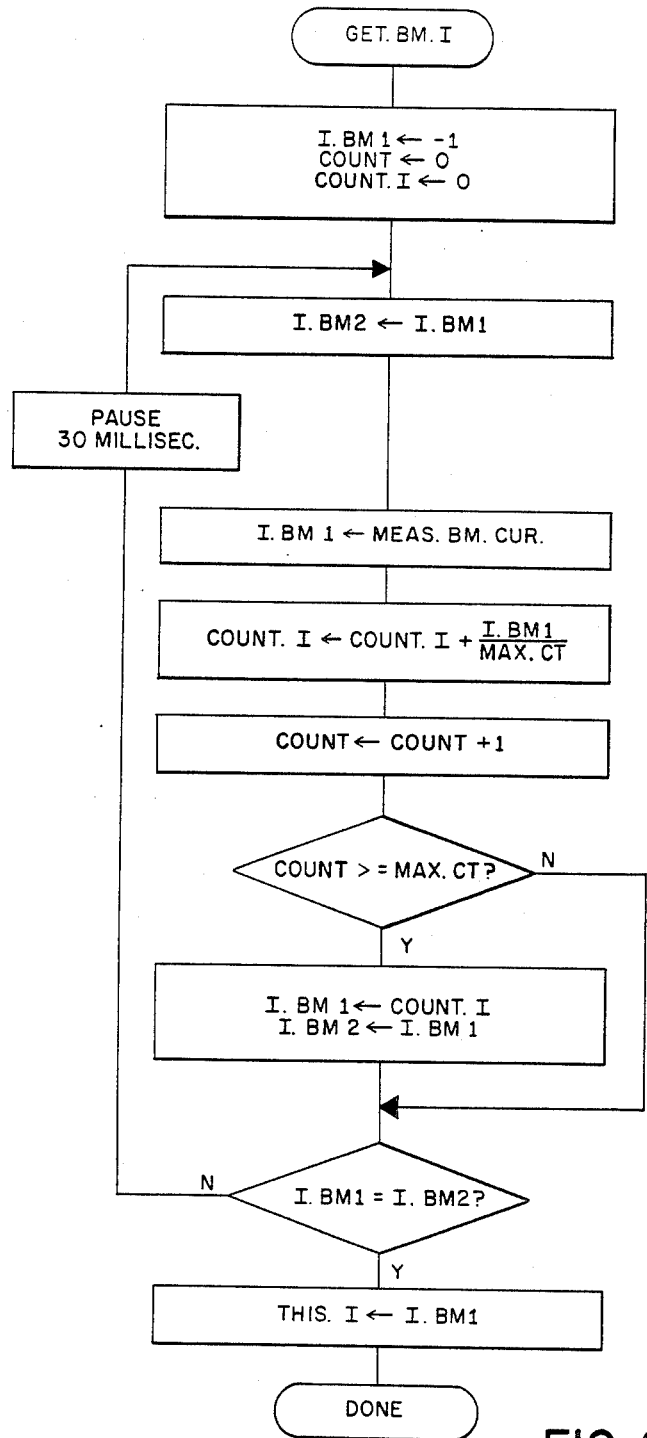

FIGS. 20A and 20B illustrate the basic steps and routines of an automatic implant routine which may be performed in the computer control system of the ion implanter system. This routine assumes that an engineer has already set up a process recipe file in the system with values recorded for performing a particular implant with a particular species. The first step in this routine is thus to look up certain process values including the dose setpoint, the scan speed, the photoresist present flag, and the percent drift constant. Following this, the previously recorded data from the last implant is cleared and a routine executed to retract the beam shutter. Then the photoresist first flag is cleared to 0 and the implant speed variable is set to the value of the scan speed read from the process recipe and the actual scan speed is determined.

Next a routine is executed to get the current value of the beam current on the beam stop. The steps of this routine will be described below. The next steps in the process are used to set a beam current value which will produce the final target dose in the wafer with an integral number of slow scans so that all areas of the wafers will be uniformly implanted. A value of use current (USE.I) and a value of the number of scans to use (SCANS.FIN) are calculated in a routine called DETERMINE USE.I & SCAN.FIN which will be described below in connection with another drawing figure.

Based on these values, it may be desired in some instances to do another routine to determine a value for the current to use when the scans to use parameter is at the next lowest integer number and try to set that current into the implanter and fall back to the values previously calculated if the higher current level cannot be achieved. The USE.I current value is then set into the implant current parameter to be available for the later DO.IMPLANT routine regardless of the setting of other current levels during intervening routines, such as the photoresist conditioning routine described below.

The routine now executes a checking step to determine if the value of the photoresist flag read from the process recipe memory has a value 1 indicating that there is photoresist on the wafers to be processed. If the value of this flag is 0, the next steps of the routine are bypassed since they are only relevant to processing wafers with photoresist.

Assuming a value of 1 for the photoresist flag, the next step is to calculate some photoresist implant values as shown in FIG. 20A. The final use current is set to the value of photoresist current (this is the no harm value of the current for the photoresist layer). Then a checking step is performed to determine if the calculated breakpoint dose is greater than or equal to the final dose setpoint. The breakpoint dose is the dose required to condition the photoresist layer on the wafer before switching to a higher current level. If that dose is less than the final dose setpoint for this implant, the switch to the higher current level is not required. Thus if this checking step returns a NO, the two step implant is required and the photoresist first flag is set to 1. Otherwise the implant current parameter is set to the final use current value which is the photoresist current value previously set. As will be seen later in the routine, a photoresist conditioning routine is bypassed if the photoresist first flag is not set to 1 and the entire DO.IMPLANT routine will be run with the implant current set to the value of the photoresist current. It would also be useful to include in this portion of the routine a checking step to determine if the available beam current is greater than the no harm beam current. If it is not, then the photoresist first flag should be set to 0 since there is no possibility of boosting the current after conditioning the photoresist.

The final step of the portion of the routine executed when the photoresist flag is at a 1 value is to set the beam current to the final use current which is the photoresist current value previously set into that parameter. (This set beam current may actually be ignored later if the photoresist first flag was not set to a 1 value during this part of the routine.)

The wafer scan wheel is now spinned up to the fast scan speed and the routine checks to see if the photoresist first flag is set to 1. This flag will be at a 0 value if the photoresist flag read from the recipe memory was at 0 value or if it wasn't set to 1 during the portion of the routine described above. If the flag value is 0, the condition photoresist wafers routine is bypassed, the beam current is set to the value of the implant current parameter and the DO.IMPLANT routine is executed directly. If the flag value is 1, then the condition photoresist wafers step is executed, followed by a resetting of the scan speed and then by setting the beam current to the final implant current value and performing of the DO.IMPLANT routine to complete the wafer implant process. After completing the implant, the PARK WHEEL routine is executed to place the scan wheel at the wafer transfer location for unloading the wafers from the wheel.

GET BEAM CURRENT (GET.BM.I) ROUTINE

The routine to determine the actual beam current hitting the beam stop is depicted in FIG. 20. Basically the routine samples the beam current at thirty millisecond intervals for a maximum of ten times (e.g. MAX.CT=10) of sampling or until two sequential current readings are found to be identical. The value returned as THIS.I is either the most recent measured current value if two identical readings were taken or the average of the ten current readings taken. It should be understood that the maximum number of readings is selected for good statistics on the beam current in case of ripple and ten is convenient to use but not critical. The detailed steps of this routine are easy to follow from the drawing and need not be set forth in detail herein.

DETERMINE USE.I AND SCAN.FIN

Figure 22:
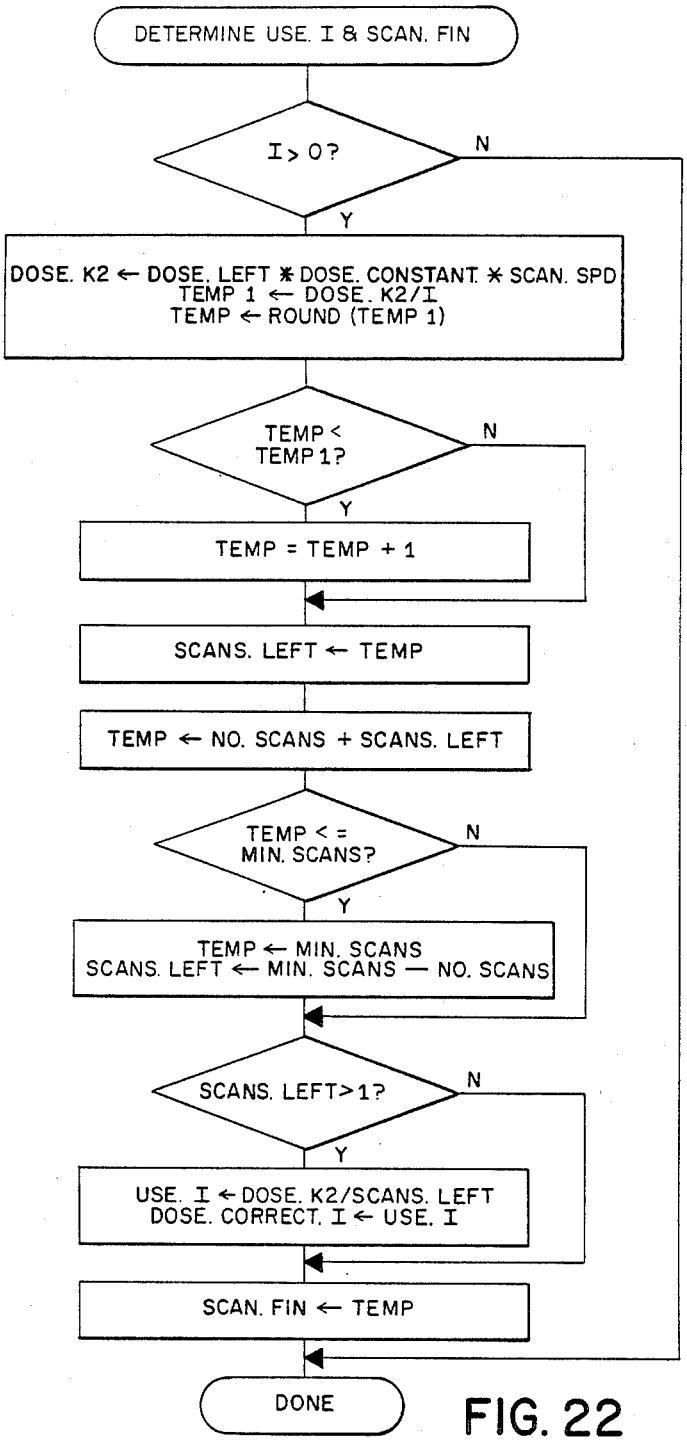

FIG. 22 illustrates the step of this routine to determine the current to use (USE.I) and a new final scan number (SCAN.FIN). The current to use number calculated is employed when first setting up the beam current for the implant to start and is also involved in controlling the current during the last few scans of the implant to achieve the target dose with a closely controlled integral number of scans. The parameters that are passed to this routine from the routine that calls it are called DOSE.LEFT, SCAN.SPD, and I (the actual beam current measured). When this routine is called from the AUTO.IMPLANT routine of FIG. 18, the parameters actually passed are the value of DOSE.SETPOINT, SCAN.SPD, and ACT.BM.I which are either locked up or measured values.

The basic purpose of this routine is to determine a new number of scans left to be done to achieve the target dose and, based on that number of scans, the current value to use to achieve the target dose in an integral number of scans. This information is used at various times in the implant process. In the first instance, it is used as part of the routine to set the initial beam current to a value which will achieve the DOSE.SETPOINT within an integral number of scans. Later, the routine is used to reset the number of total scans to be done based on the latest measured value of the beam current; but unless there is excessive beam drift, there is no tuning of the current level in the middle of the implant. When the end of the implant is close, e.g. there are five or less scans to go, this routine is actually used to set the beam current at the end of each scan to maximize the probability of achieving precisely the target dose at the end of the final scan cycle.

Assuming the current value I passed to the routine is greater than 0, the first step is to calculate the special dose constant DOSE.K2 using the equation given in the drawing. A temporary variable TEMP1 is calculated as basically the approximate number of scans that are left to achieve the dose that is left to deliver. This temporary variable is then rounded off to the next highest number by a rounding step followed by a checking step which increments the rounded value by 1 if the rounded value is less than the original value. The final value of TEMP is set into the parameter SCANS.LEFT and this temporary variable is then set to the sum of the scans left to do and the scans already done.

The next two checking step routines handle some special cases. The first checking step ensures that the the total scans done will always be at least a minimum number of scans (e.g. five scans) so that reasonable dose uniformity will be achieved by doing such minimum number of scans. This comes into play only when the process recipe has been set such that the system might try to do the entire implant with just one or two scans.

The second checking step comes into play at the end of the implant when there is only one scan left. At that point it is irrelevant to calculate the correct current level for the last scan so the current calculating step is bypassed. Otherwise the current to use, USE.I, is calculated and set into the dose correct current parameter. Finally, the total number of scans to finish, SCANS.-FIN, is set to the value of the temporary variable which has been calculated or set in prior steps. The dose correct current value and the final scans value are passed back to the routine that called this routine. As will later be seen, this routine is called at the end of each scan cycle during an implant and the total scans number may thus change during the implant if the beam current changes. The beam current setting is not changed during the middle of the implant, unless it fall out of the range limits. It is reset during the final scans of the implant as mentioned above.

CONDITION.P/R.WAFERS Routine

Figure 23:
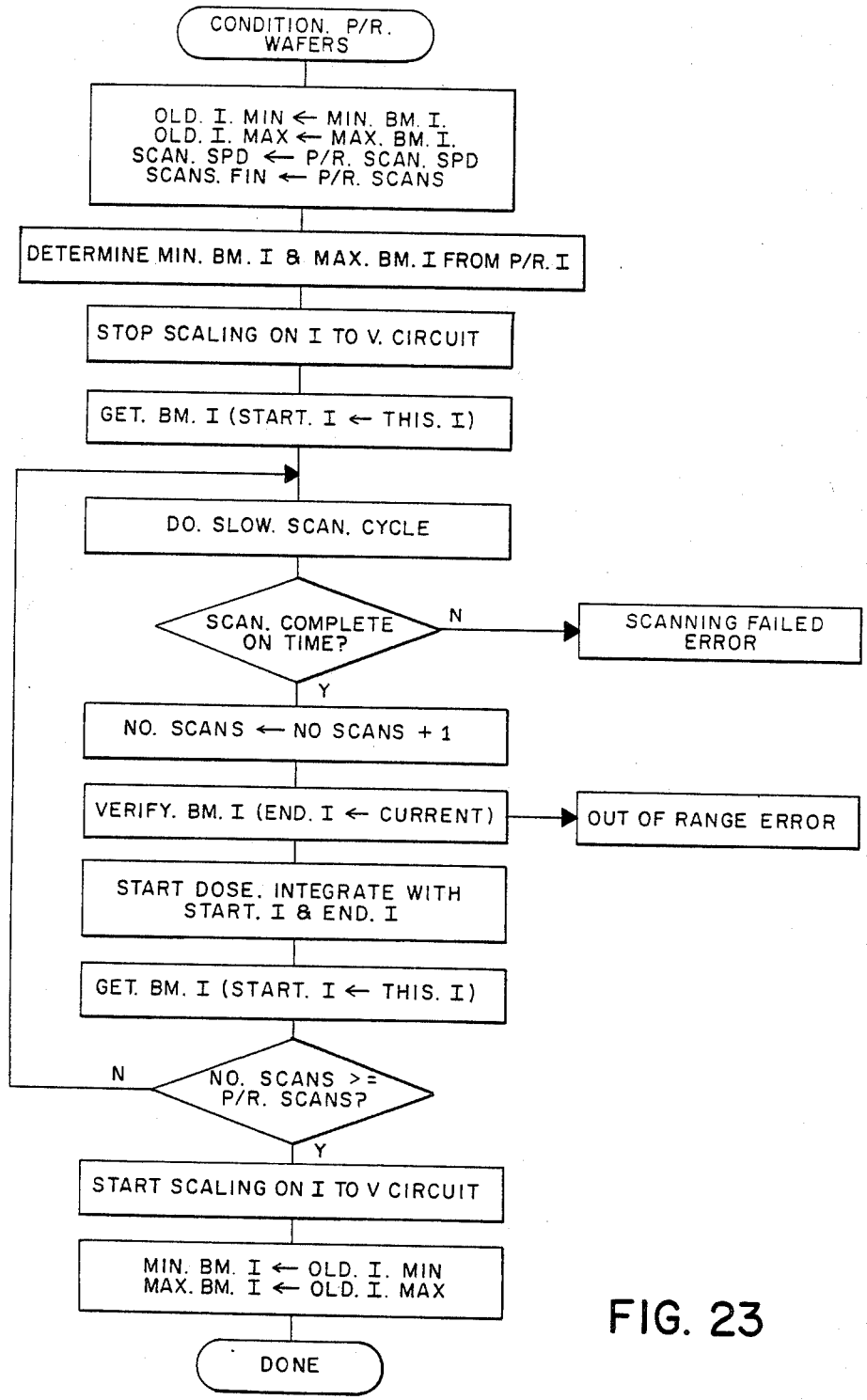
Figure 24A:
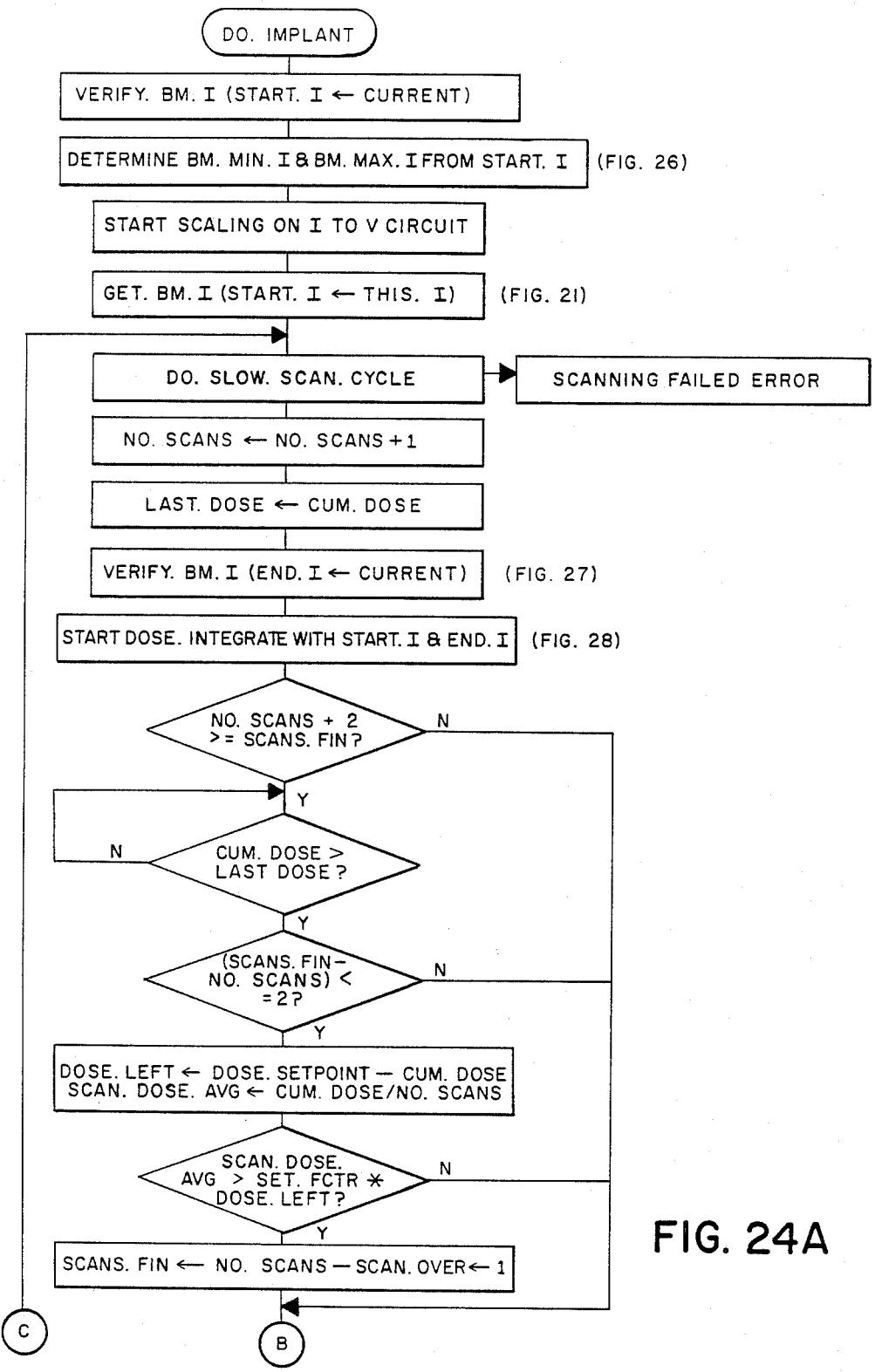
Figure 24B:
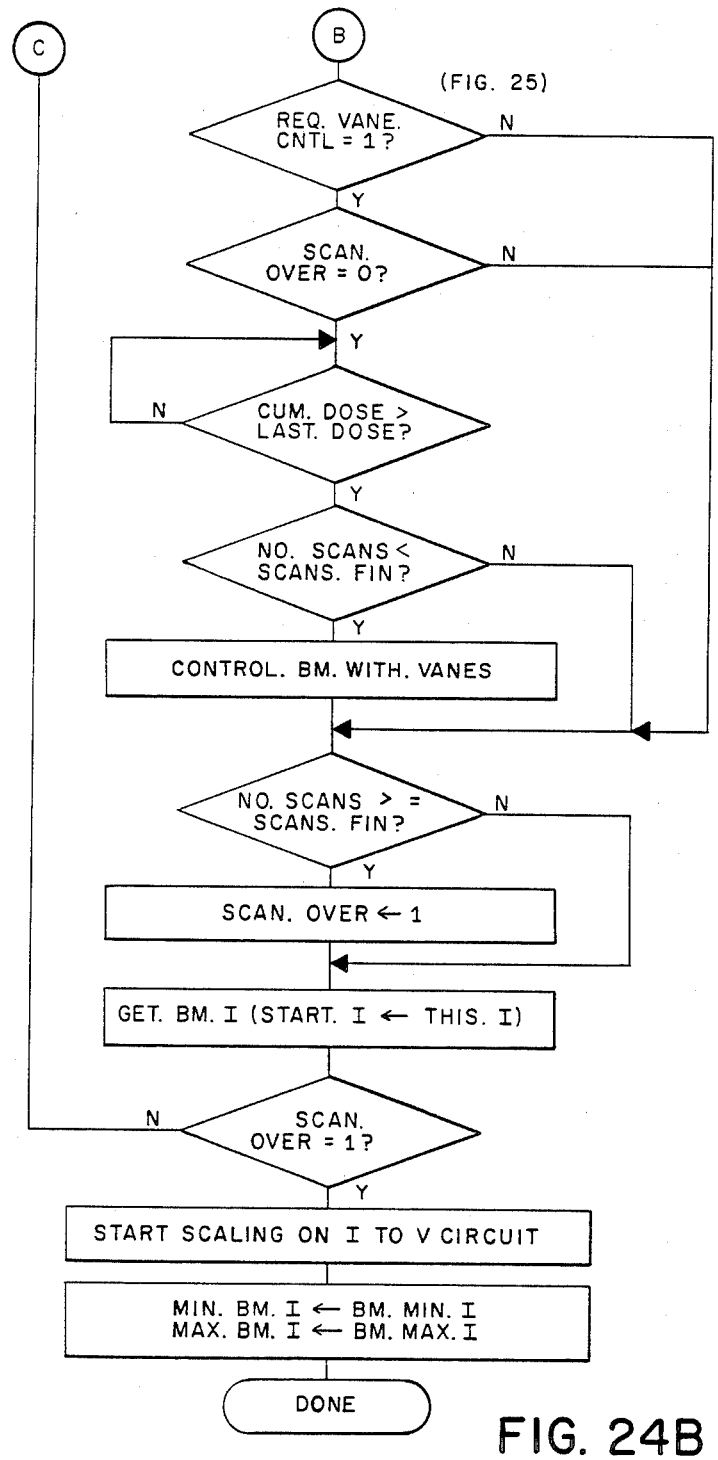

This routine is shown in FIG. 23 and has some of the same steps as the DO.IMPLANT routine shown in FIG. 24. The first step of this routine is to set certain variables as shown. The prior minimum and maximum beam current limits are saved and the scanning speed and the number of scans are set to be values previously calculated or determined in the AUTO.IMPLANT routine discussed above.

The next step is to determine the minimum and maximum beam current limits from the value of the photoresist current which has previously been calculated. It will be remembered that this photoresist current level has already been set as the actual beam current of the implanter in the routine shown in FIG. 18. Now the current to voltage circuit scaling is terminated and the get beam current routine is executed to obtain a measurement of the value of the beam current before starting the first implant cycle.

The routine then enters a loop of doing slow scan cycles, incrementing the number of scans parameter, verifying the beam current (which gives the beam current at the end of the scan as well as checking that the beam current is within range limits set—this routine is described below), passing the start and end current values to the dose integrate routine so that it can update the cumulative dose of the implant, and then getting the next start value of the beam current for the start of the next scan cycle. This loop is executed until the number of scans accumulated is greater than or equal to the number of photoresist conditioning scans that are set to be done.

After completing the execution of the loop, the current to voltage circuit is released to start scaling again and the maximum and minimum beam current limits are reestablished. As shown in FIG. 18B, the scan speed is reset to the regular implant scan speed after this photoresist conditioning routine is executed and the beam current is set to the implant current level for the balance of the implant to be run by executing the DO.IMPLANT routine.

DO.IMPLANT Routine

This routine is depicted in FIG. 24 and starts with verifying the beam current to be within range in a routine that also returns the start current value. The minimum and maximum beam current range values are then reestablished based on this start current. The scaling of the current to voltage circuit is terminated and the get beam current routine is executed to give a final starting current reading.

The routine now enters a loop that continues executing until the SCAN.OVER flag is set to a 1 value during some step in the loop. The loop starts with executing the routine of doing a scan cycle which basically takes the scan wheel back and forth through the beam. The number of scans parameter is incremented and the value of the cumulative dose parameter is set into a variable called last dose. The verify beam current routine is then executed to determine that the beam is within the set ranges and to return the end current. The start current and the end current are sent to the dose integration routine to update the dose calculation and to perform other steps that will be described below. As will be discussed below, during this DO.IMPLANT routine, the execution of the dose integration routine will cause the total number of scans setting to change if the beam current drifts during the implant.

The routine now does a series of checking steps to manage and control the implant during the last few scans. The first checking steps determines whether the number of scans already completed is within two scans of the total to be done. If it is, the the routine pauses to let the dose integration routine complete its operation. As shown, this can be sensed by checking to see if the cumulative dose parameter which is returned by the dose integrate routine is greater than the value of the last dose parameter previously set.

The next checking step determines whether the number of scans is one or two less than the total number to do (which might be different now after the dose integrate routine has run). If there are more than two more scans to do, the next steps are bypassed. If there are two or less scans left to do, the dose left and scan dose average parameters are calculated. Then a checking step determines whether the scan dose average is greater than some set factor times the value of the dose left to deliver. If this returns a YES, the implant is declared to be complete by setting the scans to complete equal to the number actually done and setting the scan over flag to a 1 value. This will effectively terminate the implant an no more slow scans will be performed since the scan over flag value set to one terminates the looping in this routine.

Figure 25:
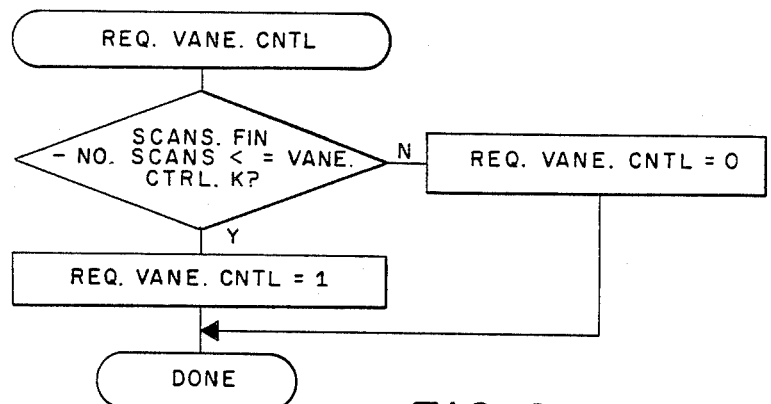

During the middle of the implant, none of these initial checking steps will be satisfied and these end of implant checks will be bypassed. The next checking step that is always run is to determine whether the require vanes contol flag has been set to 1 value. As shown in FIG. 25, this flag is set when the difference between the total scans to be done and the number already done is less than or equal to a vane control constant (e.g. five scans). If the implant is close to being finished, by returning a yes from this checking step, the scan.over flag is examined to determine if the implant is actually over. If the implant is still in progress, the routine pauses until the cumulative dose is updated from the last scan, looks to determine if the implant is finished with the updated dose, and if not completed, the control beam with vanes routine is run to set a new current value for the next scan. This control routine determines an appropriate current setting and sets the vanes accordingly for an integral number of final scans based on the measured beam current. This is done on all of the last scans to keep close control on the current and dose delivered at the end of the implant.

After the control beam with vanes routine is completed, the routine again checks to see if the implant is over, and if not, it gets the present value of the beam current as the start current value for the next scan. After the scan cycle looping is completed, the scaling of the current to voltage circuit is restarted and the maximum and minimum beam limit ranges are reestablished.

DETERMINE MIN.BM.I & MAX.BM.I Routine

Figure 26:
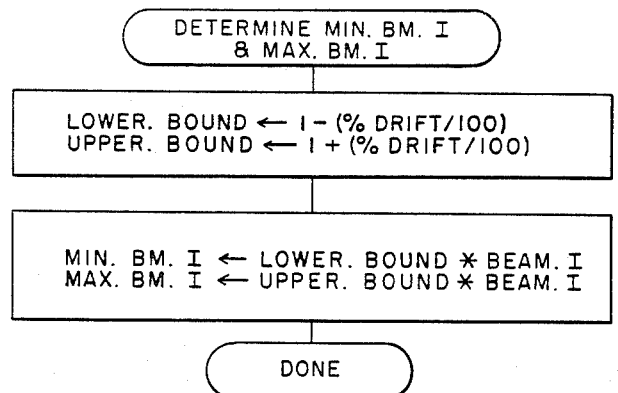

This routine is shown in FIG. 26 and simply involves setting upper and lower bounds based on the drift % parameter read from the process recipe and then setting the minimum and maximum beam current levels by multiplying the beam current value by the respective upper and lower bounds.

VERIFY.BM.I Routine

Figure 27:
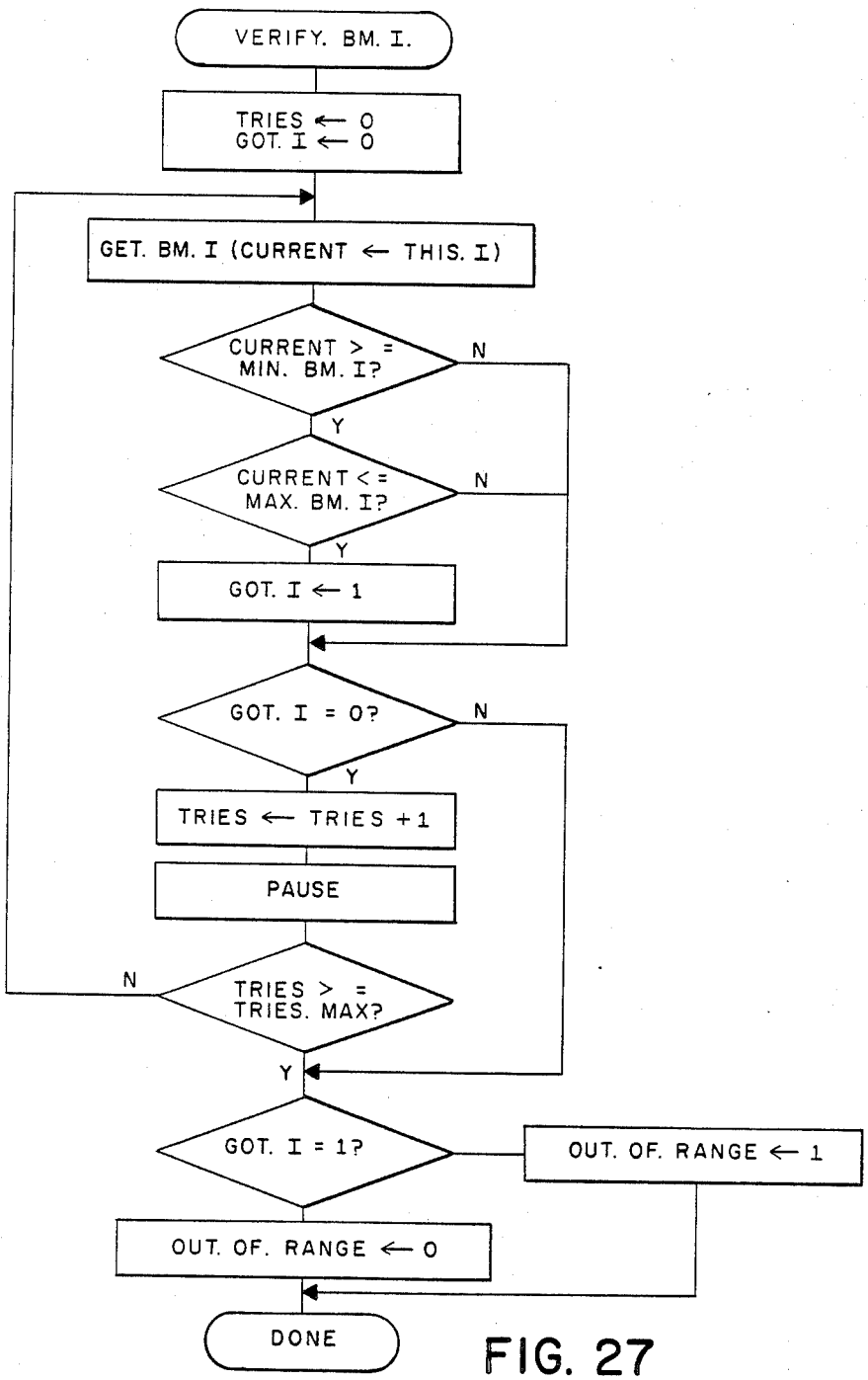

This routine is shown in FIG. 27 and basically involves trying a maximum number of times to determine that the beam current level is within the max and min limits set. The routine is simple and straightforward. The ties variable and the got current flags are first reset. Then a loop is entered and executes until either an appropriate current within range is measured or the number of times through the loop exceeds the maximum number of tries set into the machine program.

In the loop, get beam current routine described above is first executed and then two checking steps are performed to determine if the current value is within the range accepted. If it is within range, the got current flag is set to 1, and the loop is exited on the next checking step. If the current value is not within range, the tries counter variable is incremented, the routine pauses long enough for the current reading to change if there is ripple or variation present, and then the number of tries is checked to determine whether to make another loop through the routine. The last checking step looks at the value of the got current flag and sets the out of range flag depending on the value of the got current flag.

DOSE.INTEGRATE Routine

Figure 28:
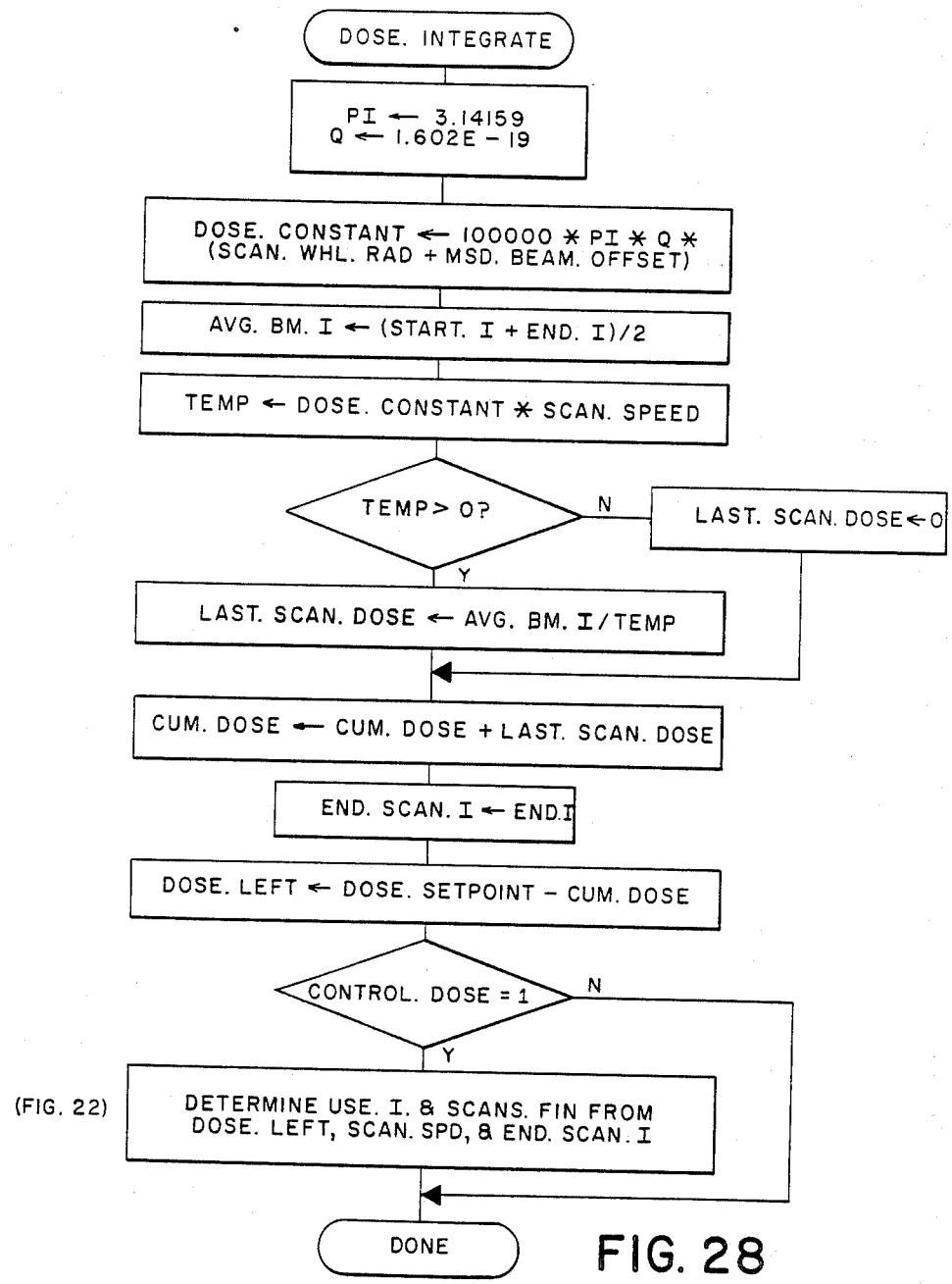

Referring to FIG. 28, the dose integrate routine is where the scan cycle dose is calculated and the cumulative dose delivered through the last scan cycle is determined. The routine starts with calculating a dose constant based on geometric aspects of the scan wheel. Then the average beam current for the last completed scan is calculated as one half of the sum of the start current and end current values that are passed to this routine when it is started. A temporary variable is then calculated for later use and checked to see that it is not a zero value to avoid attempting to divide by a zero value.

The last scan dose is then calculated and summed with the cumulative dose to obtain a new cumulative dose value. The end current is then set into an end scan current parameter and the dose left to deliver is calculated by subtracting the cumulative dose from the dose setpoint read from the process recipe. Then if the control dose flag is set to 1, the determine use current and scans final routine is executed using the dose left, scan speed and end scan current values passed to the routine shown in FIG. 22 and described above. This routine will recalculate the current to use and the total number of scans needed to complete the target implant dose based on the last current measurement. If the measured beam current changes during the implant, the new number of total scans to use gets set into the routine that is controlling the implant and this will be displayed on the screen of the system.

FIGS. 29A–29D illustrate how the set number of scans may change, especially during a long implant, as the beam current level changes. FIG. 29A shows that 132 scans have been completed and the set number of total scans is 351 at the current level that is present at that point in the implant. FIG. 29B shows that the current level has declined a small amount, and the total number of scans set has increased by one. FIG. 29C shows virtually the same beam current as in FIG. 29B, and there is no change in the number of total scans set. FIG. 29D shows that the beam current has declined substantially, but is still within the limits set. This decline in current has resulted in the number of scans set to go up from 352 to 360 since more scans are required to deliver the target dose at the lower beam current.

It should be appreciated that the software control routines shown in the drawings may include a number of other steps and would typically include additional routines such as beam checking and other diagnostic routines. They would also typically include routines for sending information to the display, routines for determining errors and the like. It will also be appreciated that the overall software for controlling the ion implanter will comprises many more routines for controlling the fast and slow scanning of the wheel and for controlling and measuring a large number of other aspects of the sophisticated implanter system.

The combination of the ion source control system and method together with the dose measuring and control system and method of this invention provides the realization of a level of automation and accuracy in control of a complex ion implanter system that has never been previously achieved. The advantage is that hands-off running of the implanter can be achieved with the engineer setting up and storing process recipes that can be called up and run in an unattended fashion by clean room processing personnel.

It should be understood that the above examples of the system and method of this invention are given by way of example only and that numerous changes could be made and variation introduced without departing from the scope of the invention as claimed in the following claims.

What is claimed is:

1. In a method for accurately measuring the dose of ions implanted into a workpiece in an ion implantation system, the steps of:
   generating an ion beam characterized by beam current stability;
   directing said ion beam along a prearranged path toward a beam collecting means;
   scanning a workpiece through said ion beam in a prearranged combined relatively fast scan directional motion and a relatively slow scan directional motion, with said workpiece entirely leaving said path of said ion beam at the end of the slow scan directional motion;

measuring ion beam current on said beam collecting means at the end of each slow scan directional motion of said workpiece;

calculating average ion beam current striking said workpiece during each slow scan directional motion as the average of two successive ion beam current measurements before and after said slow scan directional motion;

calculating ion dose delivered to said workpiece based on the calculated average ion beam current; and controlling the ion beam to a selected current level designed to provide a selected total ion dose based upon the calculated ion dose.

2. The method of claim 1 wherein the total dose of ion implanted into said workpiece during an overall implantation cycle is controlled to be substantially equal to a target implant dose by the steps of:

presetting a start current value for said ion beam and a slow scan cycles total before initiating said scanning motion of said workpiece through said beam by the steps of: measuring initial ion beam current on said beam collecting means; calculating a target ion beam current value and a slow scan cycles total value that will produce said target dose of implanted ions with an integral number of slow scan cycle motions based on said initial ion beam current associated with said fast and slow scan motions; and controlling said ion beam current to be at said target ion beam current value;

performing said workpiece scanning, beam current measuring, average current calculating, and ion dose calculating steps during a plurality of slow scan cycles cumulating toward said slow scan cycles total value;

resetting said slow scan cycles total at the end of one or more of said slow scan cycles at prearranged intervals during said implant by the steps of: determining cumulative ion dose delivered to said workpiece at the end of the last slow scan motion based on the cumulative value of calculated ion dose delivered in each of the completed slow scan cycles; recalculating a new slow scan cycles total value required to deliver the remaining ion dose to said workpiece based on the last measured value of actual ion beam current;

resetting said slow scan cycles total and said ion beam current at the end of each of a number of slow scan cycles preceding a last slow scan cycle to achieve a final delivered ion dose close to said target ion dose after a last slow scan cycle by the steps of: determining cumulative ion dose delivered to said workpiece at the end of the last slow scan motion based on the cumulative value of calculated ion dose delivered in each of the completed slow scan cycles; calculating a target ion beam current value and a slow scan cycles total value that will produce said target dose of implanted ions with an integral number of remaining slow scan cycle motions based on the last measured ion beam current; and controlling said ion beam current to be at said target ion beam current value.

3. The method of claim 2 further comprising controlling the total dose of ions implanted into a semiconductor wafer having a patterned mask layer of a photoresist material thereon where the preferred implant ion current and energy level would produce an emitted gas from the photoresist material during an initial portion of the implant at a pressure level which would harm the integrity of the implanting ion beam and including the steps of:

predetermining a no harm ion beam current level which will maintain ion beam integrity during said initial portion of said implant and a number of slow scans at said no harm current level to achieve conditioning of said photoresist material layer by said ion beam during said initial portion of said implant for reduced emission of gas at said preferred implant ion current level during a final portion of said implant;

controlling said ion beam current to be at said no harm beam current level during an initial portion of said implant;

scanning said wafer through said ion beam for said predetermined number of slow scans and at the end of each scan performing said current measuring, average current calculating, ion dose calculating, and slow scan cycles resetting steps; and controlling said ion beam current to be at said target ion beam current value during the start of said final portion of said implant.

4. In a method for implanting ions of a preselected chemical species into a semiconductor wafer to a target total dose level, the steps of:

disposing in an ion beam line an ion source having a filament-cathode within a chamber serving as an anode and having an ion emitting aperture defined therein;

supplying vapor containing said preselected species to said ion source chamber;

operating said ion source to create a stable plasma of ions of said preselected species therewithin by performing the steps of:

supplying a direct current arc voltage between said anode and said filament-cathode;

supplying direct current electrical power across said filament-cathode to produce thermionic electron emission therefrom to create and sustain a plasma of said ions;

monitoring arc current flowing between said anode and said filament-cathode;

deriving an arc current error signal as a function of the difference between said monitored arc current value and a preset arc current demand signal; and altering the voltage supplied to said filament-cathode as a function of said arc current error signal until said monitored arc current is equal to said arc current demand signal;

monitoring the value of said arc voltage; and altering the magnitude of electrical power supplied to said filament-cathode in response to detected changes in said arc voltage to return said arc voltage to substantially a preset reference value;

extracting a beam of ions through said aperture in said chamber;

analyzing said beam of ions on the basis of mass to produce an analyzed ion beam;

resolving said analyzed ion beam into a beam containing ions of said preselected chemical species;

accelerating the resolved ion beam to a preselected energy;

directing the accelerated beam toward a beam collecting means; and scanning said semiconductor wafer through said ion beam in a prearranged two directional scanning motion with a first relatively fast scanning motion comprising a circular movement of prearranged radius and a second relatively slow scanning motion involving a translation movement through said beam with said wafer being out of the path of said ion beam at the end of each of said slow scans so that all of said ion beams falls on said beam collecting means;

measuring ion beam current on said beam collecting means at the end of each slow scan motion;

calculating average ion beam current striking said wafer during each slow scan motion as the average of two successive ion beam current measurements before and after said motion;

calculating ion dose delivered to said wafer based on the calculated average ion beam current;

determining cumulative dose of ions delivered to said wafer at the end of each of said slow scan motions; and controlling the number of slow scan motions of said wafer to achieve substantially said target dose level.

5. In an ion implanting system, beam generating means for generating an ion beam characterized by beam stability and for directing said ion beam along a prearranged path;

workpiece scanning means for scanning a workpiece through said beam in a prearranged combined relatively fast scan directional motion and a relatively slow scan directional motion with said slow scan directional motion being characterized by an end of slow scan position in which said ion beam falls completely outside said workpiece scanning means;

beam stopping means disposed in the path of said beam downstream of said workpiece scanning means at the end of said slow scan position such that said beam falls completely on said beam stopping means;

and dose measuring means coupled to said beam stopping means, including means for measuring ion beam current on said beam stop at the end of scan position of said workpiece scanning means, means for calculating averge ion beam current striking said workpiece during each slow scan directional motion as the average of two successive ion beam current measurements before and after said motion; and means for calculating the ion dose delivered to said workpiece based on the calculated average ion beam current.

* * * * *

UNITED STATES PATENT AND TRADEMARK OFFICE
CERTIFICATE OF CORRECTION

PATENT NO. : 4,743,767
DATED : May 10, 1988
INVENTOR(S) : FREDERICK PLUMB ET AL

It is certified that error appears in the above-identified patent and that said Letters Patent is hereby corrected as shown below:

IN THE SPECIFICATION

In Col. 9, line 60, change "75" to --72--.

In Col. 13, line 51, change "mode" to --module--.

In Col. 13, line 56, change "involves" to --involved--.

In Col. 14, line 44, change "passes" to --pauses--.

In Col. 15, line 29, change "ca" to --can--.

In Col. 22, line 40, change "locked" to --looked--.

In Col. 25, line 32, change "ties" to --tries--.

IN THE CLAIMS

UNITED STATES PATENT AND TRADEMARK OFFICE
CERTIFICATE OF CORRECTION

PATENT NO. : 4,743,767
DATED : May 10, 1988
INVENTOR(S) : Frederick Plumb et al

It is certified that error appears in the above-identified patent and that said Letters Patent is hereby corrected as shown below:

In Claim 2, col. 27, line 18, change "ion" to -- ions --.

Signed and Sealed this

Sixth Day of December, 1988

Attest:

DONALD J. QUIGG

Attesting Officer      Commissioner of Patents and Trademarks